(12) United States Patent
Chan et al.

(10) Patent No.: US 11,181,575 B2
(45) Date of Patent: Nov. 23, 2021

(54) COMPACT TESTER

(71) Applicant: AEM Singapore Pte. Ltd., Singapore (SG)

(72) Inventors: See Jean Chan, Singapore (SG); Shiau Fen Lau, Singapore (SG); Jiun Pin Goh, Singapore (SG); Zhaomeng Wang, Singapore (SG); Seenivas Rao Balachandran, Singapore (SG); Leonard Yao Kun Mak, Singapore (SG); Prabaharan Pichaiyan, Singapore (SG)

(73) Assignee: AEM Singapore Pte. Ltd., Singapore (SG)

( * ) Notice: Subject to any disclaimer, the term of this patent is extended or adjusted under 35 U.S.C. 154(b) by 0 days.

(21) Appl. No.: 16/923,645

(22) Filed: Jul. 8, 2020

(65) Prior Publication Data

US 2021/0011078 A1 Jan. 14, 2021

(30) Foreign Application Priority Data

Jul. 8, 2019 (SG) .............................. 10201906332S

(51) Int. Cl.
*G01R 31/28* (2006.01)
(52) U.S. Cl.
CPC ................................ *G01R 31/2887* (2013.01)
(58) Field of Classification Search
CPC ........ G01R 31/02; G01R 31/04; G01R 31/26; G01R 31/28; G01R 31/2806; G01R 31/2851; G01R 31/2853; G01R 31/2891; G01R 31/2887
See application file for complete search history.

(56) References Cited

U.S. PATENT DOCUMENTS

| 5,148,100 A | 9/1992 | Sekiba |
| 6,288,561 B1 | 9/2001 | Leedy |
| 10,267,845 B2 | 4/2019 | Storey et al. |
| (Continued) | | |

OTHER PUBLICATIONS

Extended European Search Report for EP Application No. 20184676.3 dated Nov. 26, 2020.

*Primary Examiner* — Neel D Shah
(74) *Attorney, Agent, or Firm* — Carlson, Gaskey & Olds, P.C.

(57) ABSTRACT

A compact tester including a housing having a base plate and a roof plate being parallel and defining a space therebetween. The compact tester includes one or more device-under-test press units having an actuator and a contact head movable by the actuator. The compact tester includes a reinforcement arrangement having a roof reinforcement sub-arrangement coupled to the roof plate and an upright reinforcement sub-arrangement coupled to the base plate. The upright reinforcement sub-arrangement includes a pair of reinforcing side walls extending upright from the base plate. The roof reinforcement sub-arrangement includes a reinforcing structure having a reinforcing panel portion attached flat against the roof plate and an elongated reinforcing rib portion protruding from the reinforcing panel portion and away from the roof plate. The roof reinforcement sub-arrangement is supported by the upright reinforcement sub-arrangement with the elongated reinforcing rib portion extending between the pair of reinforcing side walls.

20 Claims, 16 Drawing Sheets

(56) References Cited

U.S. PATENT DOCUMENTS

2015/0355231 A1 12/2015 Rogel-Favila et al.
2018/0180663 A1 6/2018 Lin
2019/0128956 A1* 5/2019 Mardi .................... G01R 31/69

* cited by examiner

COMPACT TESTER

TECHNICAL FIELD

Various embodiments generally relate to a tester. In particular, various embodiments generally relate to a compact-sized tester for testing electronic devices.

BACKGROUND

Test systems have commonly been used for testing electronic devices. The electronic device can be a component such as a packaged integrated circuit or a fully functional product. The electronic device under testing is commonly referred to in the industry as a Device Under Test (DUT).

A conventional test system may include a test handler, a tester, a force plunger, and a temperature control within a large conventional test structure. Within the conventional test system, the various components (i.e. test handler, tester, force plunger, controller etc.) are highly dependent on each other and are required to be positioned within the large conventional test structure with tight tolerances between each other. Such large and complex conventional test systems are also costly to build.

At present, high volume testing of DUT (e.g. integrated circuit chips, semiconductor chips etc.) can only be conducted with the large and complex conventional test system.

However, the high interdependency among the components within the large conventional test system makes it difficult to perform maintenance works within the test system. For example, it may be difficult to access a point within the large test system (e.g. to perform kit changes for different form and sizes of electronic devices to be tested).

Moreover, any servicing works within the conventional test system with the interconnected components may involve working within confined spaces within the test system, which may pose safety risks.

Further, the large structure of the conventional test system also poses difficulties to maintaining a test environment, such as a low humidity environment for a cold test on DUT (e.g. integrated circuit chips or semiconductor chips etc.) In particular, the large test structure often results in air leakages.

Up to this time, conventional test systems are provided only in large sizes in order for these conventional test systems to be operational and functional.

Accordingly, there is a need to provide a more efficient and versatile solution that addresses the above problems.

SUMMARY

According to various embodiments, there is provided a compact tester. The compact tester may include a housing having a base plate and a roof plate defining a space therebetween, wherein the base plate and the roof plate are parallel to each other. According to various embodiments, the compact tester may further include one or more device-under-test (DUT) press units disposed in the space and coupled to the roof plate. According to various embodiments, each DUT press unit may include an actuator, and a contact head coupled to the actuator, the contact head being movable by the actuator along an actuation axis parallel to a direction perpendicularly extending between the base plate and the roof plate. According to various embodiments, the compact tester may further include a reinforcement arrangement having a roof reinforcement sub-arrangement coupled to the roof plate. According to various embodiments, the reinforcement arrangement may further include an upright reinforcement sub-arrangement extending from the base plate, the roof reinforcement sub-arrangement and the upright reinforcement sub-arrangement being interconnected to form the reinforcement arrangement. According to various embodiments, the upright reinforcement sub-arrangement may include a pair of reinforcing side walls, each extending upright from the base plate. According to various embodiments, the roof reinforcement sub-arrangement may include a reinforcing structure having a reinforcing panel portion attached flat against the roof plate and an elongated reinforcing rib portion protruding from the reinforcing panel portion and away from the roof plate. According to various embodiments, the roof reinforcement sub-arrangement may be supported by the upright reinforcement sub-arrangement with the elongated reinforcing rib portion extending between the pair of reinforcing side walls in a manner such that each longitudinal end of the elongated reinforcing rib portion abuts an inner surface of a corresponding reinforcing side wall and a region of the reinforcing panel portion extending immediately from each longitudinal end of the elongated reinforcing rib portion engages a top of the corresponding reinforcing sidewall. According to various embodiments, the one or more DUT press units may be coupled to the roof reinforcement sub-arrangement at the roof plate.

According to various embodiments, there is provided a tester column. According to various embodiments, the tester column may include a rack with two or more docking slots arranged vertically. According to various embodiments, the tester column may further include two or more compact testers docked into the rack.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments are described with reference to the following drawings, in which.

DETAILED DESCRIPTION

Figure 1A:
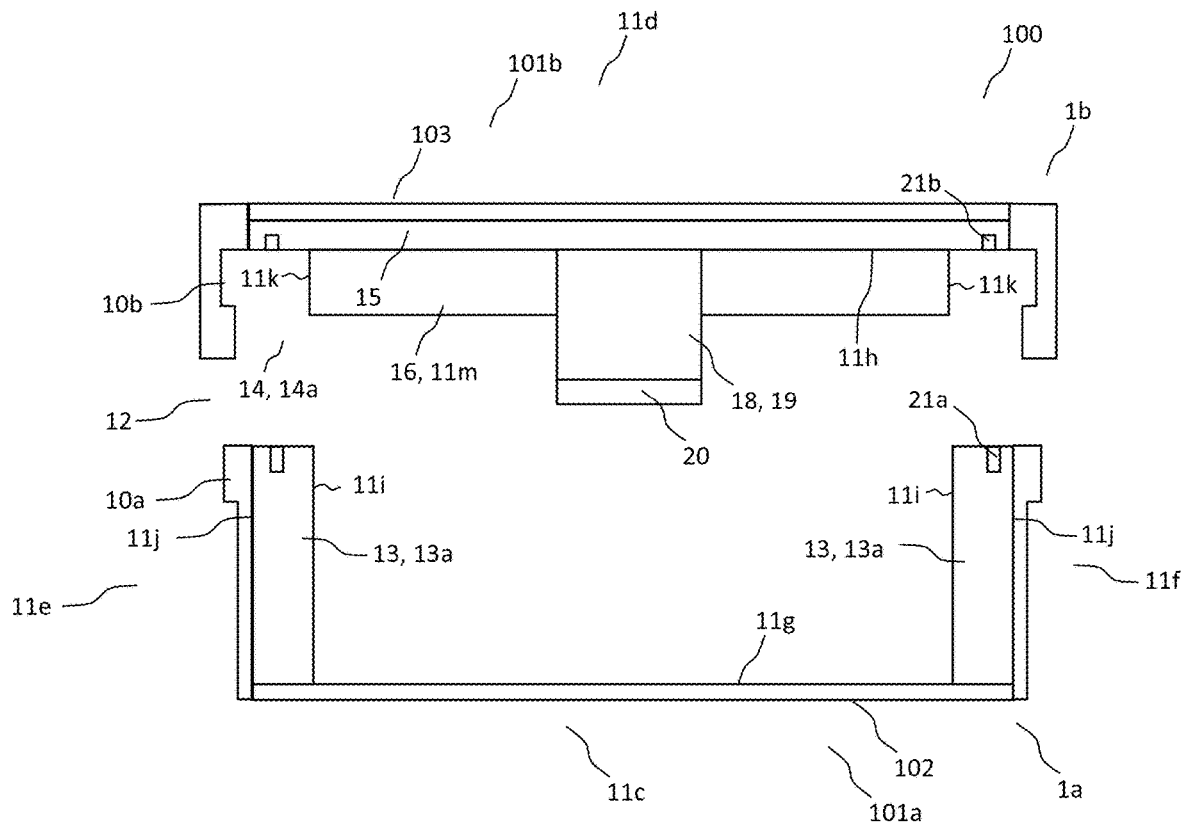
FIG. 1A shows a schematic front view of a compact tester with a decoupled housing according to various embodiments.

Embodiments described below in the context of the apparatus are analogously valid for the respective methods, and vice versa. Furthermore, it will be understood that the embodiments described below may be combined, for example, a part of one embodiment may be combined with a part of another embodiment.

It should be understood that the terms "on", "over", "top", "bottom", "down", "side", "back", "left", "right", "front", "lateral", "side", "up", "down" etc., when used in the following description are used for convenience and to aid understanding of relative positions or directions, and not intended to limit the orientation of any device, or structure or any part of any device or structure. In addition, the singular terms "a", "an", and "the" include plural references unless context clearly indicates otherwise. Similarly, the word "or" is intended to include "and" unless the context clearly indicates otherwise.

Various embodiments generally relate to a compact tester for conducting tests on electronic devices (e.g. semiconductor or semiconductor chip or integrated circuits (IC) chip tests). Various embodiments seek to provide a single compact piece of apparatus that can carry out testing which conventionally is achievable only in a complex constructed large test structure or test system. According to various embodiments, the compact tester may be capable to function by itself in a single cell or together with a test handler since the cell construction has all the necessary reinforcement structures to hold the entire test setup structure and to withstand the plunge force during testing.

Therefore, various embodiments generally relate to a compact tester which is equipped with reinforcement structures arranged in a manner so as to support the compact tester during operation. Accordingly, although the compact tester is small or scaled down in size, the reinforcement arrangement of the compact tester enables the compact tester to operate and function by supporting the compact tester (e.g. to withstand a plunger force during testing).

According to various embodiments, the compact tester may provide a single compact test setup which is functional by itself to carry out testing (e.g. semiconductor or semiconductor chip or IC chip testing). The compact tester may include connection ports for convenient connection to a power source and/or a fluid source. Accordingly, the compact tester may function independently from a test handler. Further, the compact tester may also provide a test setup that is light and compact, with the reinforcement structures built within the cell to strengthen its rigidity. Furthermore, the compact tester may provide a test setup which may be easily opened up for troubleshooting while still being connected to the power source for powering up. According to various embodiments, the desirability of building a light and mobile/portable test setup, preferably in the form of the compact tester of the various embodiments, may be of particular interest since sized-down parts for a test handler system may significantly reduce costs.

According to various embodiments, the compact tester may incorporate a test board, a thermal head, a force plunger, a test controller, a fluid system and reinforcement structures in a compact, lightweight cell/box. According to various embodiments, the compact tester may provide flexibility in switching the configurations (one, two or more thermal heads) by replacing the top parts of the test setup. According to various embodiments, the compact tester may also provide convenience in changing the kits when the IC chips to be tested are switched to different ones or when servicing is needed to be done on the test setup. According to various embodiments, the compact tester may be functional by itself and easy to carry around. According to various embodiments, since the reinforcement structures are built together in the compact tester, it may be very easy to control the tolerances and, hence, resulting in reduced fabrication cost.

According to various embodiments, the compact tester may be able to dock into a test column and be paired with a test handler for testing (e.g. semiconductor or semiconductor chip or IC chip testing). According to various embodiments, the compact tester may be a fully functional test cell that can be operated by its own, by providing current from a conventional wall power socket and the necessary fluid connections for air and coolant. According to various embodiments, depending on the test setup requirement, the compact tester can be configured to carry out various tests such as burn-in test, functional test, or system level test.

According to various embodiments, the compact tester may operate as a standalone (or independent) device, conducting its own test without being docked to a test system, but may also work together with a test system if required via connection fittings on the compact tester that allows the compact tester to communicate with the test system.

According to various embodiments, latches 4 (see FIG. 2H) may be provided on side(s) of the compact tester (e.g. cell) so that cell docking to a test column (e.g. of a test handler system) may be fast, safe and secure.

Further, according to various embodiments, a test setup for the compact tester may be contained within a cell (e g small confined space). As a result, a condensation-free zone within the cell may be achieved easily. Accordingly, the compact tester may provide a cost-effective way to maintain low humidity of a testing environment, which is particularly useful for cold tests. The compact size (i.e. small volume) of the operational compact tester of the various embodiments may make it easy to maintain a minimum amount of air leak from the test setup as well as to maintain an air pressure within an inner enclosure of the compact tester.

The following examples pertain to further embodiments:

Example 1 is a compact tester, including: a housing having a base plate and a roof plate defining a space therebetween, wherein the base plate and the roof plate are parallel to each other. The compact tester of Example 1 may further include one or more device-under-test (DUT) press units disposed in the space and coupled to the roof plate, each DUT press unit having: an actuator, and a contact head coupled to the actuator, the contact head being movable by the actuator along an actuation axis parallel to a direction perpendicularly extending between the base plate and the roof plate. The compact tester of Example 1 may further include a reinforcement arrangement having: a roof reinforcement sub-arrangement coupled to the roof plate, and an upright reinforcement sub-arrangement extending from the base plate, the roof reinforcement sub-arrangement and the upright reinforcement sub-arrangement being interconnected to form the reinforcement arrangement, wherein the upright reinforcement sub-arrangement includes a pair of reinforcing side walls, each extending upright from the base plate, wherein the roof reinforcement sub-arrangement includes a reinforcing structure having a reinforcing panel portion attached flat against the roof plate and an elongated reinforcing rib portion protruding from the reinforcing panel portion and away from the roof plate, wherein the roof reinforcement sub-arrangement is supported by the upright reinforcement sub-arrangement with the elongated reinforcing rib portion extending between the pair of reinforcing side walls in a manner such that each longitudinal end of the elongated reinforcing rib portion abuts an inner surface of a corresponding reinforcing side wall and a region of the reinforcing panel portion extending immediately from each longitudinal end of the elongated reinforcing rib portion engages a top of the corresponding reinforcing sidewall, wherein the one or more DUT press units is coupled to the roof reinforcement sub-arrangement at the roof plate.

In Example 2, the subject matter of Example 1 may optionally include: wherein the pair of reinforcing side walls of the upright reinforcement sub-arrangement are extending upright from opposite edges of the base plate.

In Example 3, the subject matter of Example 1 or 2 may optionally include: wherein a length of the elongated reinforcing rib portion of the roof reinforcement sub-arrangement is equal to a distance apart between the inner surfaces of the pair of reinforcing side walls of the upright reinforcement sub-arrangement.

In Example 4, the subject matter of any one of Examples 1 to 3 may optionally include: wherein the reinforcing panel portion of the roof reinforcement sub-arrangement is of an elongated form having an elongated flat surface which is attached flat against the roof plate with a length of the reinforcing panel portion extending across opposite edges of the roof plate.

In Example 5, the subject matter of any one of Examples 1 to 4 may optionally include: wherein the elongated reinforcing rib portion of the roof reinforcement sub-arrangement is in the form of a long thin ridge along the reinforcing panel portion and protruding perpendicularly from the reinforcing panel portion and away from the roof plate.

In Example 6, the subject matter of Example 4 or 5 may optionally include: wherein the elongated reinforcing rib portion of the roof reinforcement sub-arrangement is aligned longitudinally with the reinforcing panel portion in the elongated form.

In Example 7, the subject matter of any one of Examples 1 to 6 may optionally include: one or more DUT test sockets disposed inside the housing; and an electronic control arrangement disposed inside the housing, the electronic control arrangement having: a DUT press unit main controller coupled to the roof plate, and a test controller coupled to the base plate, whereby the test controller is for controlling a test program run in a DUT plugged into the one or more DUT test sockets.

In Example 8, the subject matter of Example 7 may optionally include: wherein the electronic control arrangement further includes: a first connector coupled to the test controller at the base plate, and a second connector coupled to the DUT press unit controller at the roof plate, wherein the first connector and the second connector are removably coupled to each other so as to electrically couple the DUT press unit controller and the test controller.

In Example 9, the subject matter of any one of Examples 1 to 8 may optionally include: wherein the housing includes: a first housing part including the base plate, and a second housing part including the roof plate, wherein the first housing part and the second housing part are removably couplable to each other, wherein the first housing part and the second housing part are coupled together in a coupled configuration to form a complete housing enclosure structure whereby the base plate and the roof plate are parallel to each other.

In Example 10, the subject matter of any Example 9 may optionally include: an interlocking arrangement including: a first interlocking element coupled to the first housing part, and a second interlocking element coupled to the second housing part, wherein the first interlocking element and the second interlocking element are interlockable to hold the first housing part and the second housing part together in a manner so as to be non-separable in the direction perpendicularly extending between the base plate and the roof plate when the housing is in the coupled configuration.

In Example 11, the subject matter of any one of Examples 1 to 10 may optionally include: a drawer coupled to the housing in a manner so as to be slidably retractable and extendable relative to the housing between an extended position and a retracted position, wherein in the extended position, the drawer is extended out of the housing, and wherein in the retracted position, the drawer is inserted into the space between the roof plate and the base plate of the housing.

In Example 12, the subject matter of Example 11 may optionally include: wherein the reinforcement arrangement further includes: a drawer reinforcement sub-arrangement having one or more support slabs disposed between an underneath surface of the drawer and the base plate and aligned between the pair of reinforcing sidewalls, wherein each support slab abuts an underneath surface of the drawer when the drawer is in the retracted position.

In Example 13, the subject matter of Example 11 or 12 in combination with Example 7 may optionally include: wherein the one or more DUT test sockets are disposed on the drawer in a manner such that one or more DUT test sockets are aligned with the one or more DUT press units when the drawer is in the retracted position.

In Example 14, the subject matter of any one of Examples 1 to 13 may optionally include: at least one local controller circuit board electrically coupled to the one or more DUT press units; wherein the at least one local controller circuit board is affixed to the reinforcing rib portion of the roof reinforcement sub-arrangement.

In Example 15, the subject matter of any one of Examples 1 to 14 may optionally include: wherein each reinforcing side wall includes at least one opening in the reinforcing side wall extending all the way through from the inner surface to an outer surface.

In Example 16, the subject matter of Example 15 may optionally include: wherein each reinforcing side wall includes a pair of openings in a side-by-side arrangement with a divider portion of the reinforcing side walls separating the pair of openings laterally, wherein the divider portion of the pair of reinforcing side walls and the one or more DUT press units are aligned in a straight row.

In Example 17, the subject matter of any one of Examples 1 to 16 may optionally include: wherein the reinforcement arrangement further includes: a base reinforcement sub-arrangement having a base reinforcing panel attached flat against the base plate, wherein the pair of reinforcing side walls of the upright reinforcement sub-arrangement are extending upright from opposite edges of the base reinforcing panel.

In Example 18, the subject matter of Example 17 in combination with Example 2 may optionally include: wherein the base reinforcing panel is of an elongated shape having an elongated flat surface which is attached flat against the base plate with a length of the base reinforcing panel extending across the opposite edges of the base plate.

Example 19 is a tester column, including: a rack with two or more docking slots arranged vertically; and two or more compact testers of any one of claims 1 to 19 docked into the rack.

In Example 20, the subject matter of Example 19 may optionally include: a distribution center; and a testers management arrangement coupled to the distribution center, the testers management arrangement including hardware components and devices connecting the distribution center to each docking slots.

Figure 1B:
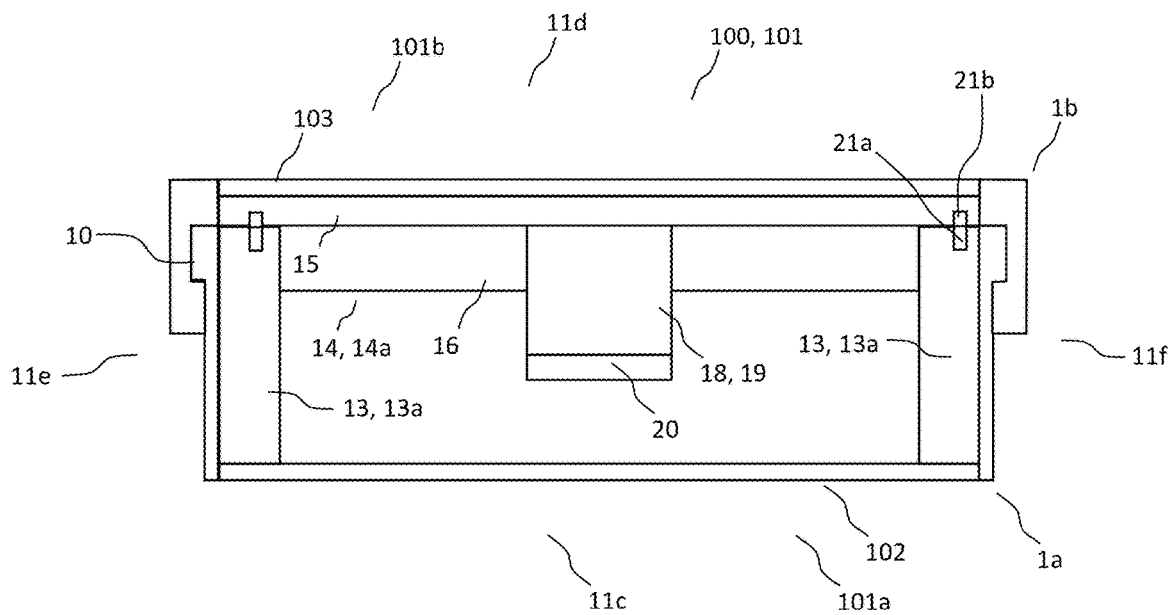
FIG. 1B shows a schematic front view of a compact tester with a coupled housing according to various embodiments.
Figure 1C:
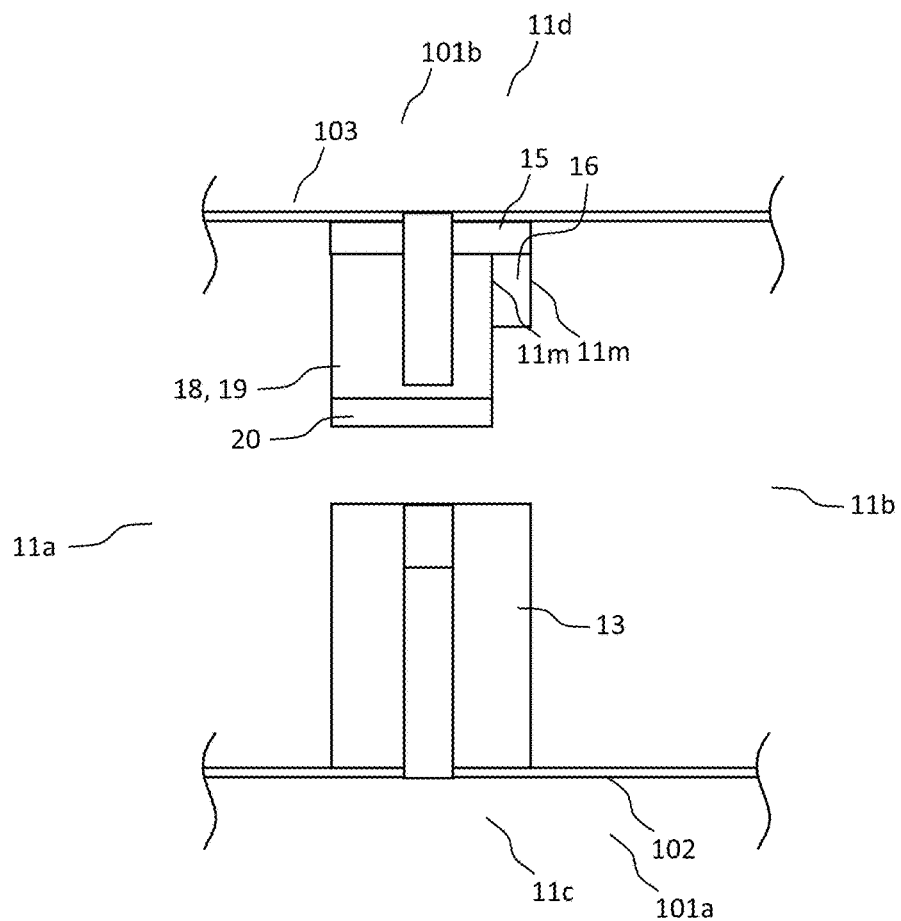
FIG. 1C shows a partial schematic side view of the compact tester of FIG. 1A according to various embodiments.
Figure 1D:
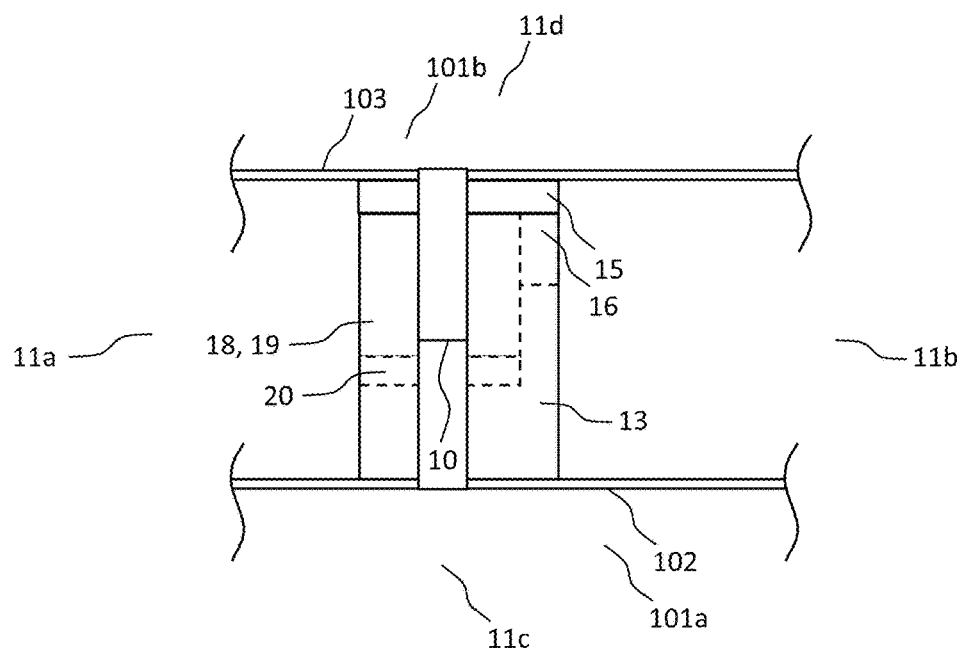
FIG. 1D shows a partial schematic side view of the compact tester of FIG. 1B according to various embodiments.
Figure 1E:
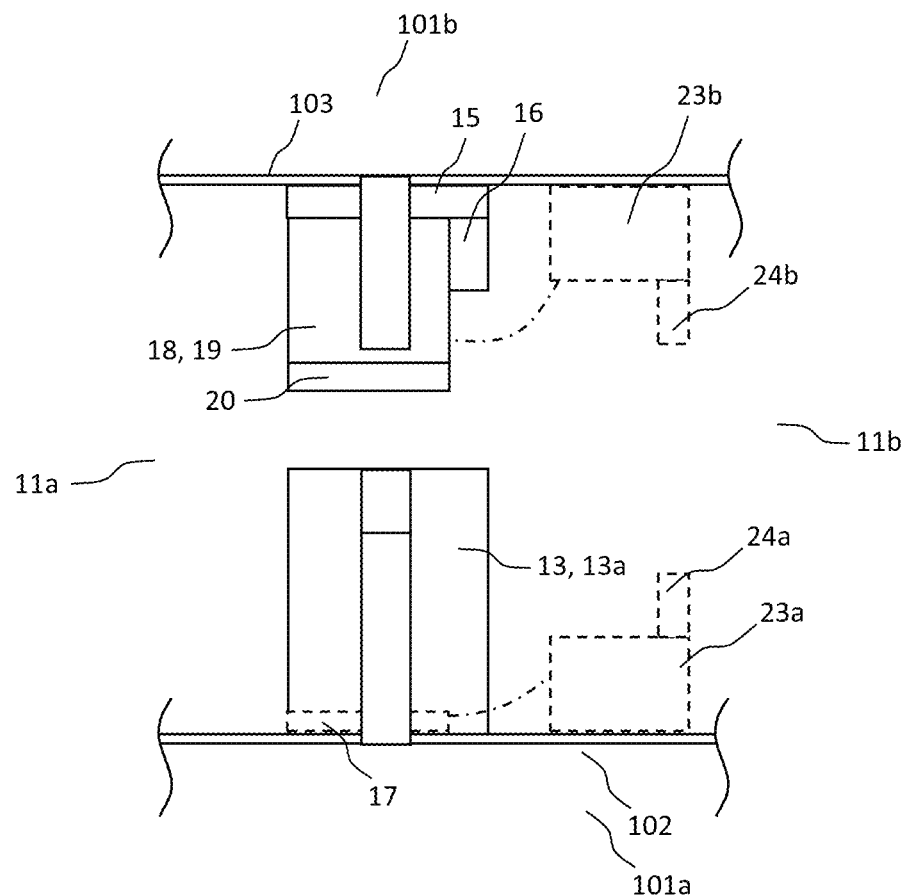
FIG. 1E shows a partial schematic side view of the compact tester of FIG. 1A with an electronic control arrangement and an adapter according to various embodiments.
Figure 1F:
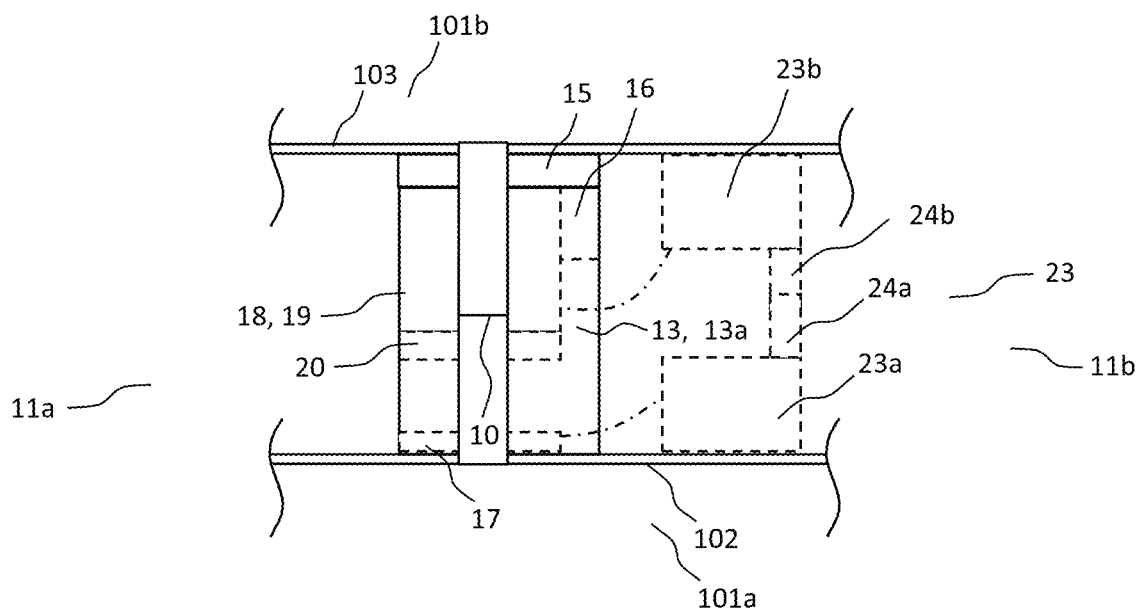
FIG. 1F shows a partial schematic side view of the compact tester of FIG. 1B with the electronic control arrangement and the adapter according to various embodiments.

FIG. 1A shows a schematic front view of a compact tester 100 with a decoupled housing 101 according to various embodiments; FIG. 1B shows a schematic front view of a compact tester 100 with a coupled housing 101 according to various embodiments; FIG. 1C shows a partial schematic side view of the compact tester 100 of FIG. 1A according to various embodiments; FIG. 1D shows a partial schematic side view of the compact tester 100 of FIG. 1B according to various embodiments; FIG. 1E shows a partial schematic side view of the compact tester 100 of FIG. 1A with an electronic control arrangement 23 and a test socket 17 according to various embodiments; and FIG. 1F shows a partial schematic side view of the compact tester 100 of FIG. 1B with the electronic control arrangement 23 and the test socket 17 according to various embodiments.

According to various embodiments, a compact tester 100 (or a tester or a test cell) may be provided.

According to various embodiments, the compact tester 100 may include a housing 101. According to various embodiments, the housing 101 may include or may be formed of at least two detachable and interconnectable (or removably couplable) housing parts 101a, 101b. The at least two housing parts 101a, 101b may be separated from each other (e.g. for troubleshooting, change of package, or performing maintenance etc.) in a disassembled configuration (i.e. separated configuration) and may be connected or secured to each other via an interlocking arrangement 10 to form the housing 101 in an assembled configuration (i.e. coupled configuration). Accordingly, the housing 101 may be completely separated into at least two housing parts (i.e. kept apart or set apart from each other so as to be independent of each other, and be free of or without any connections therebetween) and, thereafter, may be connected to each other by means of the interlocking arrangement 10. According to various embodiments, the housing 101, for example, a top housing part of the housing 101, may include handles 7 (see FIG. 2A) which may be used to flip the top housing part over so that maintenance works may be conducted on the compact tester 100. In the assembled configuration, the handles 7 may be used to lift the compact tester 100 (e.g. with hands). Accordingly, the compact tester 100 may be a mobile or portable tester that may be moved around physically.

According to various embodiments, the housing 101 may include a first (or bottom) housing part 101a and a second (or top) housing part 101b (i.e. two housing parts) which are removably couplable to each other. According to various embodiments, when the first and the second housing parts 101a, 101b or the at least two housing parts are coupled to each other via the interlocking arrangement 10 in the assembled configuration, the first and the second housing parts 101a, 101b or the at least two housing parts may be immovable with respect to each other. According to various embodiments, the interlocking arrangement 10 may include a first interlocking element 10a coupled to the first housing part 101a and a second interlocking element 10b coupled to the second housing part 101b. According to various embodiments, the first interlocking element 10a and the second interlocking element 10b may be interlockable to hold the first housing part 101a and the second housing part 101b together in a manner so as to be non-separable in a direction perpendicularly extending between the first housing part 101a and the second housing part 101b when the housing 101 is in the assembled configuration. According to various embodiments, the interlocking arrangement 10 may include a removable fastener, for example, bolt and nut, threaded screws and threaded screw-holes, latches, catches, locking pins, snap fastener, snap-fitting, male/female coupling assembly, etc. Accordingly, the first interlocking element 10a and the second interlocking element 10b may be a corresponding element of the removable fastener.

According to various embodiments, the first housing part 101a and the second housing part 101b may be coupled together in the assembled (or coupled) configuration to form a complete housing enclosure structure defining an enclosed space. According to various embodiments, the complete housing enclosure may be a shell or casing etc. defining an enclosed space therewithin.

According to various embodiments, the housing 101 may have a cuboidal shape (or form). According to various embodiments, the housing 101 may include at least six faces or surfaces: a front face 11a, a rear face 11b opposite the front face 11a, a bottom or lower or underneath face 11c, a top or upper or topmost face 11d opposite the bottom face 11c, and two opposite lateral or side or flank faces 11e, 11f.

According to various embodiments, the housing 101 (or body of the housing 101) may have a dimension (or a length of the housing 101) along a longitudinal axis of the housing 101 perpendicularly extending between the front face 11a and the rear face 11b of the housing 101 that is longer than a dimension (or a width of the housing 101) along a lateral axis of the housing 101 perpendicularly extending between the two lateral faces 11e, 11f of the housing 101. According to various embodiments, it is understood that the dimension of the housing 101 may be varied depending on configuration and requirements. For example, according to various embodiments, the dimension along the longitudinal axis extending between the front face 11a and the rear face 11b of the housing 101 may also be equal to or shorter than the dimension along the lateral axis extending between the two lateral faces 11e, 11f of the housing 101.

According to various embodiments, the first housing part 101a may include a first casing structure 1a forming the front face 11a, the bottom face 11b, and the two opposite lateral faces 11e, 11f of the housing 101. According to various embodiments, the second housing part 101b may include a second casing structure 1b forming the top face 11d and the rear face 11b of the housing 101. According to various embodiments, it is understood that the first casing structure 1a forming the first housing part 101a may include various combination of faces of the housing 101. Similarly, the second casing structure 1b forming the second housing part 101b may also include various combination of faces of the housing 101. According to various embodiments, the bottom face 11c and the top face 11d of the housing 101 may not be formed in the same casing structure and may be only formed in separate casing structures. Accordingly, the first casing structure 1a forming the first housing part 101a may include the bottom face 11c and the second casing structure 1b forming the second housing part 101b may include the top face 11d.

According to various embodiments, the first housing part 101a of the housing 101 may include a base plate 102. Accordingly, the housing 101 may include the base plate 102. According to various embodiments, the base plate 102 may be, for example, a thin flat piece of rigid or hard material serving as part of the first casing structure 1a forming the bottom face 11c of the housing 101. According to various embodiments, the base plate 102 may be of a rectangular shape.

According to various embodiments, the second housing part 101b of the housing 101 may include a roof plate 103. Accordingly, the housing 101 may include the roof plate 103. According to various embodiments, the roof plate 103 may be, for example, a thin flat piece of rigid or hard material serving as part of the second casing structure 1b forming the top face 11d of the housing 101. According to various embodiments, the roof plate 103 may be of a rectangular shape. According to various embodiments, the roof plate 103 and the base plate 102 may be of the same shape and size.

According to various embodiments, in the assembled configuration of the housing 101, the base plate 102 and the roof plate 103 may be parallel to each other and may define a space therebetween. According to various embodiments, the space or distance between the base plate 102 and the roof plate 103 may define a height of the enclosed space of the housing 101.

According to various embodiments, the compact tester 100 may further include a reinforcement arrangement 12. According to various embodiments, the reinforcement arrangement 12 may include an upright reinforcement sub-arrangement 13 extending from the base plate 102 and a roof reinforcement sub-arrangement 14 coupled to the roof plate 103. According to various embodiments, the upright reinforcement sub-arrangement 13 and the roof reinforcement sub-arrangement 14 may be interconnected to form the reinforcement arrangement 12.

According to various embodiments, the upright reinforcement sub-arrangement 13 may be associated with the first housing part 101a. According to various embodiments, the upright reinforcement sub-arrangement 13 may extend vertically upwards from the base plate 102 of the first housing part 101a. For example, the upright reinforcement sub-arrangement 13 may be extending vertically upwards from an upper planar surface 11g of the base plate 102 of the first housing part 101a. According to various embodiments, the upright reinforcement sub-arrangement 13 may be extending perpendicularly (e.g. substantially perpendicularly) from the upper planar surface 11g of the base plate 102.

According to various embodiments, elements of the upright reinforcement sub-arrangement 13 may be disposed along a segment (or portion or fragment) of a corresponding lateral face 11e, 11f of the housing 101. According to various embodiments, elements of the upright reinforcement sub-arrangement 13 may be thicker than the structures forming the lateral faces of the housing 101.

According to various embodiments, the upright reinforcement sub-arrangement 13 may be entirely formed of or may comprise a different material (e.g. more rigid material) relative to the material of the structures forming the lateral faces of the housing 101.

According to various embodiments, elements of the upright reinforcement sub-arrangement 13 may be part of the housing 101 and may form the lateral faces of the housing 101. Accordingly, in such embodiments, the housing 101 may be free of additional structures forming the lateral faces of the housing 101.

According to various embodiments, the upright reinforcement sub-arrangement 13 may include a pair of reinforcing side walls 13a. Accordingly, the pair of reinforcing side walls 13a may be the elements of the upright reinforcement sub-arrangement 13. According to various embodiments, each side wall 13a may be extending upright from the base plate 102 of the first housing part 101a. According to various embodiments, the pair of reinforcing side walls 13a may be extending upright in a parallel manner According to various embodiments, the pair of reinforcing side walls 13a may be a pair of opposing and/or parallel reinforcing side walls 13a extending upright from opposite edges (e.g. lateral edges 11e, 11f) of the base plate 102 of the first housing part 101a. Accordingly, the pair of opposing and/or parallel reinforcing side walls 13a may have inwardly directed opposing surfaces (or inner surfaces) 11i. Accordingly, each side wall 13a of the pair may be disposed on the base plate 102 at a corresponding lateral edge 11e, 11f of the base plate 102. Hence, a corresponding inwardly directed surface (or inner surface) 11i of a side wall 13a of the pair may oppose (or face or be directed to or be in register with) a corresponding inwardly directed surface 11i of the other side wall 13a of the pair.

According to various embodiments, each of the pair of reinforcing side walls 13a of the upright reinforcement sub-arrangement 13 may withstand a compressive or tensile force (or load) acting along a vertical direction between the bottom (e.g. lower) end 11c and the top (e.g. upper) end 11d of the reinforcing side wall 13a. According to various embodiments, each of the pair of reinforcing side walls 13a of the upright reinforcement sub-arrangement 13 may not deform under a force (or load) typically encountered during testing, and may further safeguard the housing 101 from deforming or collapsing. Accordingly, the upright reinforcement sub-arrangement 13 may contribute to enabling testing to be conducted in the compact tester 100. Hence, an operational and functional compact-sized tester (e.g. test cell) 100 may be provided.

According to various embodiments, each of the pair of reinforcing side walls 13a of the upright reinforcement sub-arrangement 13 may further include at least one opening (or through-hole) in the reinforcing side wall 13a extending all the way through between the inwardly directed lateral surface (or inner surface) 11i and the outwardly directed lateral surface (or outer surface) 11j of the reinforcing side wall 13a. According to various embodiments, an axis of the opening may be parallel (e.g. substantially parallel) to the lateral axis of the housing 101.

According to various embodiments, the roof reinforcement sub-arrangement 14 may be associated with the second housing part 101b. According to various embodiments, the roof reinforcement sub-arrangement 14 may be coupled to the roof plate 103 of the second housing part 101b. According to various embodiments, the roof reinforcement sub-arrangement 14 may be coupled to an underneath planar surface 11h of the roof plate 103. According to various embodiments, the roof reinforcement sub-arrangement 14 may extend laterally across the roof plate 103 between the two lateral edges 11e, 11f of the roof plate 103 or from one lateral edge 11e to another lateral edge 11f of the roof plate 103. Accordingly, the roof reinforcement sub-arrangement 14 may extend across a width of the second housing part 101b (or across the second housing part 101b in a direction parallel to the lateral axis of the housing 101).

According to various embodiments, with the housing 101 in the assembled configuration, while the reinforcement sub-arrangement 14 is coupled to the roof plate 103 of the second housing part 101b, the reinforcement sub-arrangement 14 is also supported by the upright reinforcement sub-arrangement 13 extending vertically upwards from the base plate 102. Accordingly, the upright reinforcement sub-arrangement 13 and the reinforcement sub-arrangement 14 may be interconnected to form the reinforcement arrangement 12 which reinforces or strengthens the housing 101 so as to enable the compact tester 100 to be capable of withstanding the force or load during testing while allowing the compact tester 100 to be of a reduced/compact size.

According to various embodiments, the roof reinforcement sub-arrangement 14 may include a reinforcing structure 14a having a reinforcing panel portion 15 and an elongated reinforcing rib portion 16.

According to various embodiments, the reinforcing panel portion 15 of the roof reinforcement sub-arrangement 14 may be attached flat against the roof plate 103. According to various embodiments, the reinforcing panel portion 15 may be a thin and flat element of the reinforcing structure 14a providing a broad contact surface for attaching flat against the roof plate 103. According to various embodiments, the reinforcing panel portion 15 of the roof reinforcement sub-arrangement 14 may be of an elongated form having an elongated flat surface which is attached flat against the roof plate 103. According to various embodiments, the reinforcing panel portion 15 of the roof reinforcement sub-arrangement 14 may be of a rectangular shape and may have a rectangular flat surface attached flat against the roof plate 103. According to various embodiments, the reinforcing panel portion 15 of the roof reinforcement sub-arrangement 14 in the elongated form may be positioned longitudinally across opposite edges (or lateral edges 11e, 11f) of the roof plate 103.

According to various embodiments, when the reinforcing panel portion 15 of the roof reinforcement sub-arrangement 14 is in the elongated form, a length of the reinforcing panel portion 15 of the roof reinforcement sub-arrangement 14 may be equal to a distance between the two opposite edges (or lateral edges 11e, 11f) of the roof plate 103.

According to various embodiments, the reinforcing panel portion 15 may be shaped to engage with the upright reinforcement sub-arrangement 13 of the first housing part 101a. According to various embodiments, when the first and the second housing parts 101a, 101b are connected to each other to form the coupled housing 101, the reinforcing panel portion 15 may engage (e.g. indirectly or directly) or contact the respective upper surfaces (or a top) of the pair of reinforcing side walls 13a of the upright reinforcement sub-arrangement 13.

According to various embodiments, the reinforcing rib portion 16 may protrude from a surface (e.g. underneath surface) of the reinforcing panel portion 15, which is opposite the contact surface (e.g. upper surface) of the reinforcing panel portion 15. Accordingly, the elongated reinforcing rib portion 16 and the contact surface of the reinforcing panel portion 15 may be on opposite sides of the reinforcing panel portion 15.

According to various embodiments, with the housing 101 in the assembled configuration, the roof reinforcement sub-arrangement 14 which is coupled to the roof plate 103 may be supported by the upright reinforcement sub-arrangement 13 with the elongated reinforcing rib portion 16 of the roof reinforcement sub-arrangement 14 extending between the pair of reinforcing side walls 13a of the upright reinforcement sub-arrangement 13. Accordingly, the upright reinforcement sub-arrangement 13 may hold the reinforcing panel portion 15 of the roof reinforcement sub-arrangement 14 across the pair of reinforcing side walls 13a of the upright reinforcement sub-arrangement 13 such that the elongated reinforcing rib portion 16 of the roof reinforcement sub-arrangement 14 may be located between the pair of reinforcing side walls 13a. Accordingly, the elongated reinforcing rib portion 16 of the roof reinforcement sub-arrangement 14 may protrude downwards from the reinforcing panel portion 15 of the roof reinforcement sub-arrangement 14 and away from the roof plate 103 to be in between the pair of reinforcing side walls 13a of the upright reinforcement sub-arrangement 13. According to various embodiments, the reinforcing panel portion 15 may be interposed between the roof plate 103 and the elongated reinforcing rib portion 16.

According to various embodiments, each longitudinal end 11k of the elongated reinforcing rib portion 16 of the roof reinforcement sub-arrangement 14 may abut a corresponding inner surface 11i of a corresponding reinforcing side wall 13a. Accordingly, the elongated reinforcing rib portion 16 of the roof reinforcement sub-arrangement 14 may be extending across a full length of the distance between the pair of reinforcing side walls 13a of the upright reinforcement sub-arrangement 13 such that the longitudinal ends 11k of the elongated reinforcing rib portion 16 is touching or adjoining or contacting the inner surfaces 11i of the pair of reinforcing side walls 13a.

According to various embodiments, a region of the reinforcing panel portion 15 extending immediately from each longitudinal end 11k of the elongated reinforcing rib portion 16 may engage the top of the corresponding reinforcing sidewall 13a. Accordingly, the regions of the reinforcing panel portion 15 that extend longitudinally outwards from the longitudinal ends 11k of the elongated reinforcing rib portion 16, which (or so as to) form overhanging portions with respect to the elongated reinforcing rib portion 16 in the longitudinal direction, may interconnect with the pair of reinforcing side walls 13a of the upright reinforcement sub-arrangement 13. According to various embodiments, a length of the elongated reinforcing rib portion 16 may be shorter than a length of the reinforcing panel portion 15 along the longitudinal direction of the elongated reinforcing rib portion 16. A dimension (i.e. width) of the roof plate 103 between the lateral side ends of the second housing part 101b may be longer or larger than a dimension (i.e. length)

of the elongated reinforcing rib portion 16 between the longitudinal side ends 11k of the elongated reinforcing rib portion 16.

According to various embodiments, a length of the elongated reinforcing rib portion 16 of the roof reinforcement sub-arrangement 14 may be equal to a distance apart between the inner surfaces 11i of the pair of reinforcing side walls 13a of the upright reinforcement sub-arrangement 13. Accordingly, the elongated reinforcing rib portion 16 of the roof reinforcement sub-arrangement 14 may extend from the inner surface 11i of a first reinforcing side wall 13a of the pair of reinforcing side walls 13a to the inner surface 11i of a second reinforcing side wall 13a of the pair of reinforcing side walls 13a.

According to various embodiments, the elongated reinforcing rib portion 16 of the roof reinforcement sub-arrangement 14 may be aligned longitudinally with the reinforcing panel portion 15, for example, when the reinforcing panel portion 15 is in the elongated form. Accordingly, the elongated reinforcing rib portion 16 may be parallel to a longitudinal axis of the elongated reinforcing panel portion 15.

According to various embodiments, the elongated reinforcing rib portion 16 of the roof reinforcement sub-arrangement 14 may be a reinforcement ridge structure. According to various embodiments, the elongated reinforcing rib portion 16 may be in the form of a long thin ridge along the reinforcing panel portion 15 and protruding perpendicularly from the reinforcing panel portion 15 and away from the roof plate 103. Accordingly, the elongated reinforcing rib potion 16 may be an elongated flange or elongated panel-like formation whereby a width direction of the elongated flange or elongated panel-like formation is perpendicular to the reinforcing panel portion 15 and a length direction of the elongated flange or elongated panel-like formation runs alongside or is parallel to the reinforcing panel portion 15.

According to various embodiments, the elongated reinforcing rib portion 16 of the roof reinforcement sub-arrangement 14 may be a separate entity or piece from the reinforcing panel portion 15 of the roof reinforcement sub-arrangement 14. Accordingly, the reinforcing panel portion 15 may be a separate piece.

According to various embodiments, the reinforcing panel portion 15 may be may be integrally joined or connected or coupled or welded to the elongated reinforcing rib portion 16 to form a single complete roof reinforcement sub-arrangement 14.

According to various embodiments, the elongated reinforcing rib portion 16 and the reinforcing panel portion 15 of the roof reinforcement sub-arrangement 14 may be integrally molded or casted or printed as a monolithic structure to form a single complete roof reinforcement sub-arrangement 14.

According to various embodiments, the elongated reinforcing rib portion 16 of the roof reinforcement sub-arrangement 14 may have a uniform cross-sectional profile along the entire length or body of the elongated reinforcing rib portion 16. Accordingly, the elongated reinforcing rib portion 16 may have a uniform cross-sectional area when looking from either longitudinal end 11k of the elongated reinforcing rib portion 16. According to various embodiments, the elongated reinforcing rib portion 16 may be straight along its length or may have a straight body.

According to various embodiments, the reinforcing panel portion 15 and the elongated reinforcing rib portion 16 of the roof reinforcement sub-arrangement 14 may form a T-shaped cross-sectional profile or an inverted L-shaped cross-sectional profile with respect to the longitudinal direction of the elongated reinforcing rib portion 16. According to various embodiments, the roof reinforcement sub-arrangement 14 may include two parallel elongated reinforcing rib portions 16 protruding from the reinforcing panel portion 15. Accordingly, the reinforcing panel portion 15 and the two parallel elongated reinforcing rib portions 16 of the roof reinforcement sub-arrangement 14 may form an inverted U-shaped cross-sectional profile with respect to the longitudinal direction of the elongated reinforcing rib portion 16.

According to various embodiments, a thickness of the reinforcing panel portion 15 and/or the elongated reinforcing rib portion 16 of the roof reinforcement sub-arrangement 14 may be thicker than a thickness of the roof plate 103. According to various embodiments, the elongated reinforcing rib portion 16 may be entirely formed of or may include a different material (e.g. more rigid material) from the roof plate 103.

According to various embodiments, the elongated reinforcing rib portion 16 of the roof reinforcement sub-arrangement 14 may strengthen the roof plate 103. In particular, the elongated reinforcing rib portion 16 may enhance a resistance against a bending force (or moment) along the reinforcing panel portion 15 in the longitudinal direction of the elongated reinforcing rib portion 16. According to various embodiments, the roof reinforcement sub-arrangement 14 may provide resistance against deformation or bending under an actuation force during testing, and safeguards the roof plate 103 of the housing 101 from deforming or bending. Accordingly, the roof reinforcement sub-arrangement 14 may contribute to enabling testing to be conducted in the compact tester 100. Hence, an operational and functional compact-sized tester (e.g. test cell) 100 may be provided.

According to various embodiments, the elongated reinforcing rib portion 16 may further serve as a rigid structure to which other components, such as one or more DUT press units 18 or a local controller circuit board (e.g. printed circuit board) etc., may be secured or attached. Accordingly, the other components may be attached or secured to at least one or both of the planar surface 11m of the elongated reinforcing rib portion 16 which are directed towards the front 11a of the housing 101 or the rear 11b of the housing 101.

According to various embodiments, the elongated reinforcing rib portion 16 may include at least one opening (or through-hole) in the elongated reinforcing rib portion 16 extending all the way through between the planar surfaces 11m of the elongated reinforcing rib portion 16 which are respectively directed towards the front 11a of the housing 101 and the rear 11b of the housing 101. According to various embodiments, an axis of the opening may be parallel (e.g. substantially parallel) to the longitudinal axis of the housing 101.

According to various embodiments, the compact tester 100 may further include one or more DUT test sockets 17 (e.g. mounting/interface or test board) disposed in the housing 101. For example, the DUT test socket 17 may be coupled to the first housing part 101a.

According to various embodiments, the DUT test socket 17 may be configured and adapted to support and/or secure and/or establish an electrical connection with at least one DUT for testing by the compact tester 100. According to various embodiments, the compact tester 100 may include a socket board having 'N' number of DUT test sockets 17 (e.g. 8-DUT test sockets 17) for supporting testing of 'N' number of DUT.

According to various embodiments, the compact tester 100 may include one or more device-under-test (DUT) press units 18 (e.g. force plunger). According to various embodiments, the DUT press unit 18 may be disposed in the space between the base plate 102 and the roof plate 103 of the housing 101. According to various embodiments, the DUT press unit 18 may be coupled to the roof plate 103 of the housing 101 in a manner so as to be in alignment with a corresponding DUT test socket 17 disposed in the housing 101.

According to various embodiments, the DUT press unit 18 may be coupled to the roof reinforcement sub-arrangement 14 at the roof plate 103 of the housing 101. Accordingly, the DUT press unit 18 may be coupled to the roof plate 103 of the housing 101 via the roof reinforcement sub-arrangement 14. For example, a base portion of the DUT press unit 18 may be affixed directly to the elongated reinforcing rib portion 16 of at least one roof reinforcement sub-arrangement 14 coupled to the roof plate 103 of the housing 101.

According to various embodiments, the DUT press unit 18 may include an actuator 19. According to various embodiments, the actuator 19 may include a linear actuator. According to various embodiments, the DUT press unit 18 may further include a contact head 20 coupled to the actuator 19. The contact head 20 may be movable by the actuator 19 along an actuation axis parallel to the direction perpendicularly extending between the base plate 102 and the roof plate 103 of the housing 101 in the assembled configuration. According to various embodiments, the actuator 19 may be actuated to move the contact head 20 away from the roof plate 103 or retract the contact head 20 towards the roof plate 103.

According to various embodiments, the contact head 20 may interface with the DUT plugged into the corresponding DUT test socket 17 for testing. According to various embodiments, the DUT test socket 17 may be capable of executing a test program for testing the DUT. According to various embodiments, the contact head 20 may be actuated by the actuator 19 of the DUT press unit 18 for contacting the DUT during testing of the DUT in the DUT test socket 17. According to various embodiments, the contact head 20 may include or may be a thermal head. Accordingly, the contact head 20 may regulate a temperature of the DUT being tested in the DUT test socket 17. According to various embodiments, each contact head 20 may be interchangeable with another contact head 20. According to various embodiments, the contact head 20 and the DUT test socket 17 may be configured to perform various types of test, including burn-in test, functional test, system level test etc. depending on the setup required by a user.

According to various embodiments, the compact tester 100 may provide flexibility in switching or changing the configuration of one or more DUT press units 18 and corresponding contact head 20. For example, one, two or more than two contact head 20 and actuator 19 pair may be used in the compact tester 100 simply by configuring (e.g. replacing) the top part (or the second housing part 101b) of the test setup (i.e. compact tester 100). Furthermore, the compact tester 100 provides convenience in changing the kits to match different DUTs (e.g. integrated chips or semiconductor chips) to be tested.

According to various embodiments, with the first and the second housing parts 101a, 101b of the housing 101 being connected to each other (i.e. in the assembled configuration), the at least one upright reinforcement sub-arrangement 13, the at least one roof reinforcement sub-arrangement 14 and the one or more DUT press units 18 may be contained within the enclosed space of the housing 101. According to various embodiments, reinforcement arrangement 12 including the at least one upright reinforcement sub-arrangement 13 and the at least one roof reinforcement sub-arrangement 14 may line an interior surface of the housing 101 which surrounds a region of the enclosed space of the housing 101 in which the one or more DUT press units 18 is disposed. Accordingly, the reinforcement arrangement 12 may strengthen the portion of the housing 101 which may be subjected to the plunge force or the actuation force from the one or more DUT press units 18.

According to various embodiments, with the housing 101 in the assembled configuration, each roof reinforcement sub-arrangement 14 may be engaged with and be in alignment with at least two (or at least a pair of) reinforcing side walls 13a of the upright reinforcement sub-arrangement 13. In particular, the elongated reinforcing rib portion 16 of the roof reinforcement sub-arrangement 14 may be positioned between inwardly directed opposing surfaces (or inner surfaces) 11i of the pair of reinforcement side walls 13a in a manner such that each longitudinal end 11k of the elongated reinforcing rib portion 16 may abut (e.g. directly contact or indirectly contact via at least one intervening member) a respective inwardly directed opposing surface 11i of the pair of reinforcement side walls 13a. Accordingly, a length of the elongated reinforcing rib portion 16 may be equal to a distance apart between the inner surfaces 11i of the pair of reinforcement side walls 13a.

Further, the reinforcing panel portion 15 of each roof reinforcement sub-arrangement 14 may engage (e.g. directly engage or indirectly engage via at least one intervening member or coupling) the top of the upright reinforcement sub-arrangement 13.

In other words, according to various embodiments, the roof reinforcement sub-arrangement 14 and the upright reinforcement sub-arrangement 13 may be interconnected to form the reinforcement arrangement 12 when the housing 101 is in the assembled configuration. According to various embodiments, with the housing 101 in the assembled configuration, the roof reinforcement sub-arrangement 14 may be placed over the upright reinforcement sub-arrangement 13 with the elongated reinforcing rib portion 16 extending between the pair of reinforcing side walls 13a of the upright reinforcement sub-arrangement 13 in a manner such that each longitudinal end 11k of the elongated reinforcing rib portion 16 abuts the inner surface 11i of the corresponding reinforcing side wall 13a and the region of the reinforcing panel portion 15 extending immediately from each longitudinal end 11k of the elongated reinforcing rib portion 16 engages the top of the corresponding reinforcing side wall 13a.

According to various embodiments, in the housing 101, each DUT press unit 18 may be coupled to the elongated reinforcing rib portion 16 of the roof reinforcement sub-arrangement 14. According to various embodiments, each DUT press unit 18 may also be positioned between the pair of reinforcing side walls 13a.

Figure 1G:
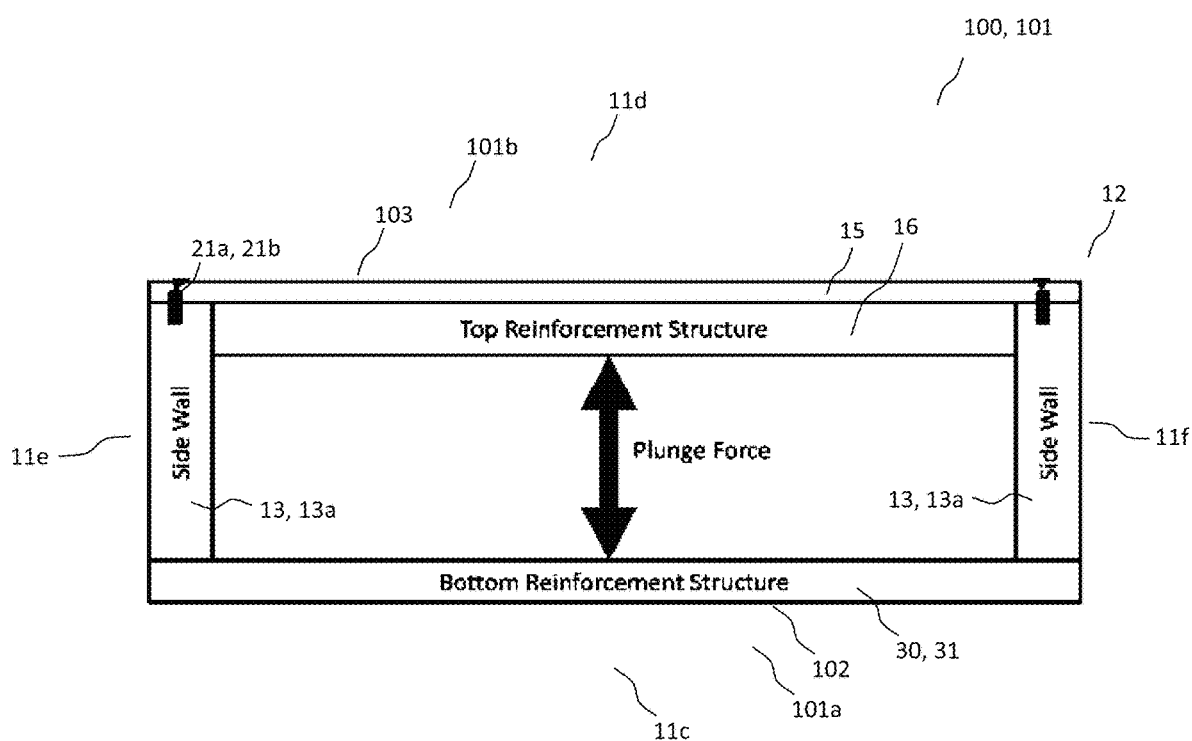
FIG. 1G shows a schematic diagram of a force exerted by a DUT press unit with respect to a reinforcement arrangement of a compact tester according to various embodiments.

FIG. 1G shows a schematic diagram of a force exerted by a DUT press unit with respect to a reinforcement arrangement 12 of a compact tester 100 according to various embodiments. According to various embodiments, the reinforcement arrangement 12 may further include a base reinforcement sub-arrangement 30. According to various embodiments, the base reinforcement sub-arrangement 30 may include a base reinforcing panel 31. According to various embodiments, the base reinforcing panel 31 may be attached flat against the base plate 102 of the housing 101.

According to various embodiments, the base reinforcing panel 31 may include a broad contact surface for attaching flat against the base plate 102.

Figure 2A:
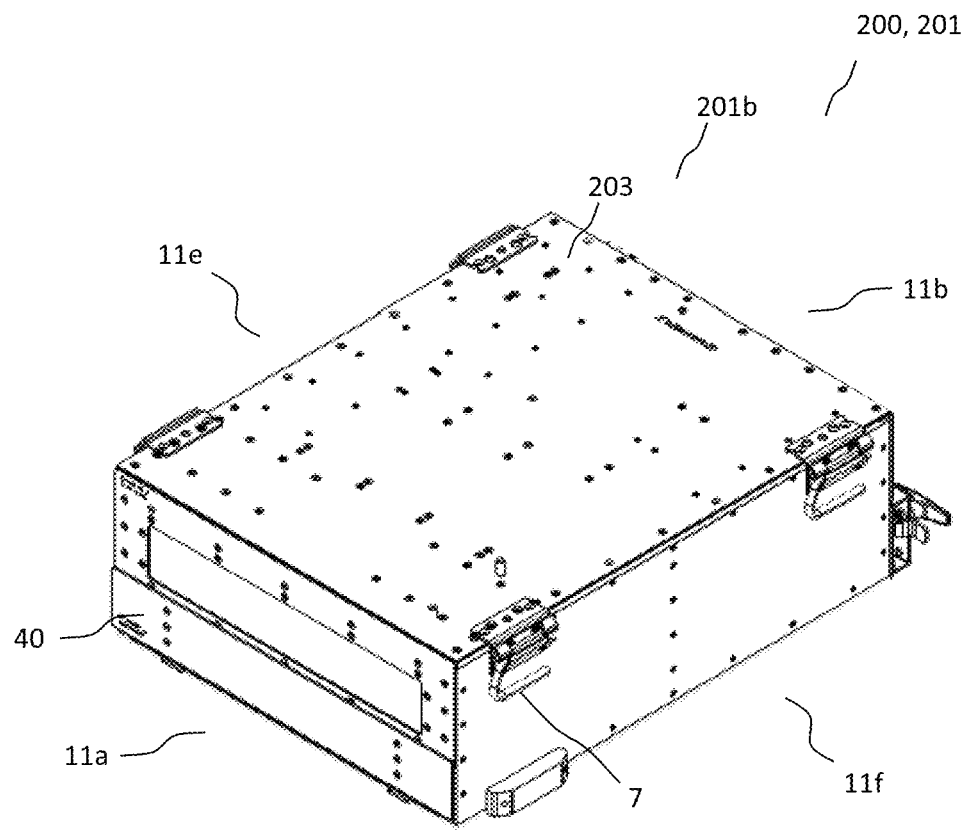
FIG. 2A shows a front perspective view of a compact tester with a housing in the assembled configuration according to various embodiments.
Figure 2B:
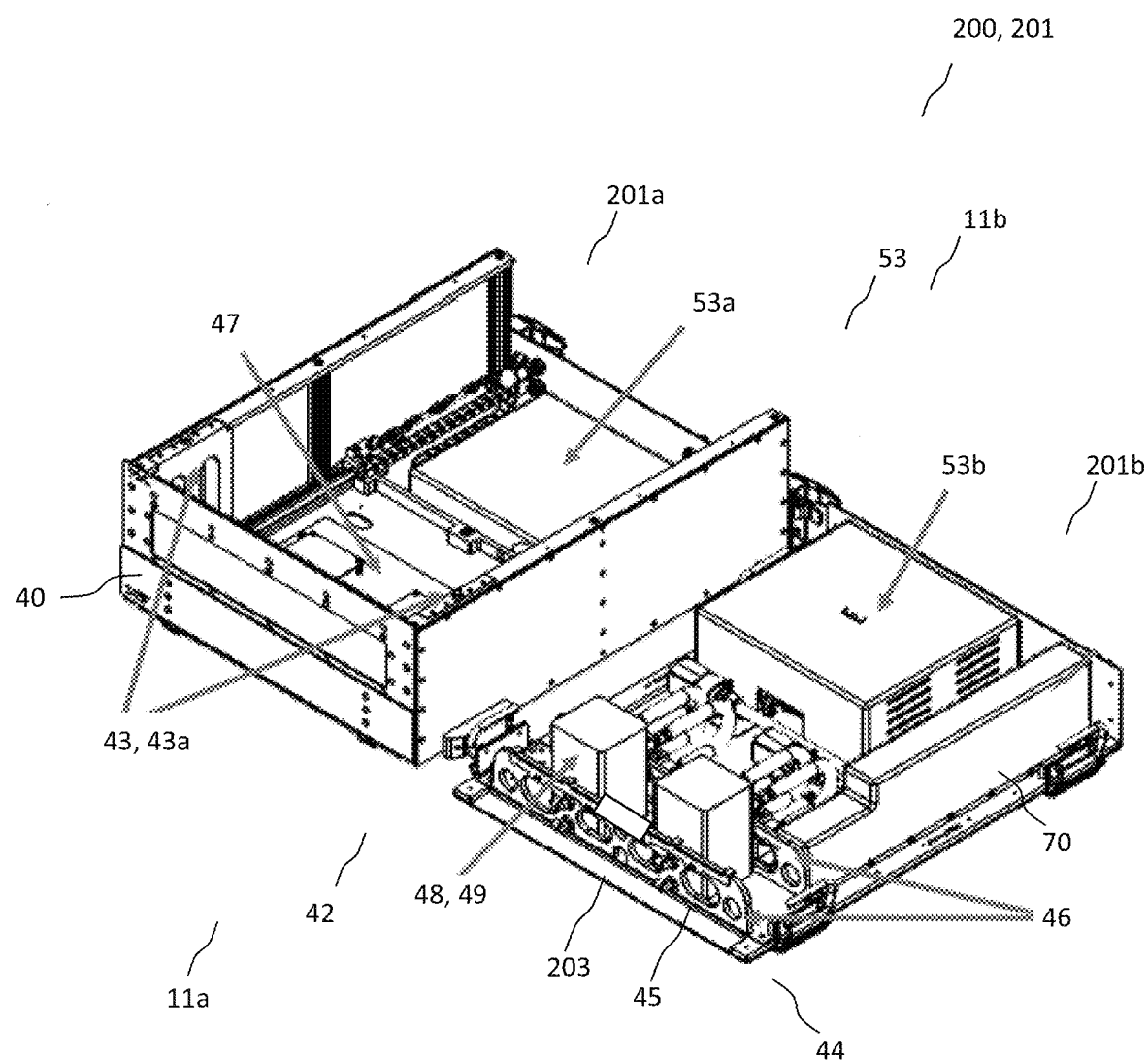
FIG. 2B shows a perspective view of the compact tester of FIG. 2A with the housing in the separated configuration according to various embodiments.
Figure 2C:
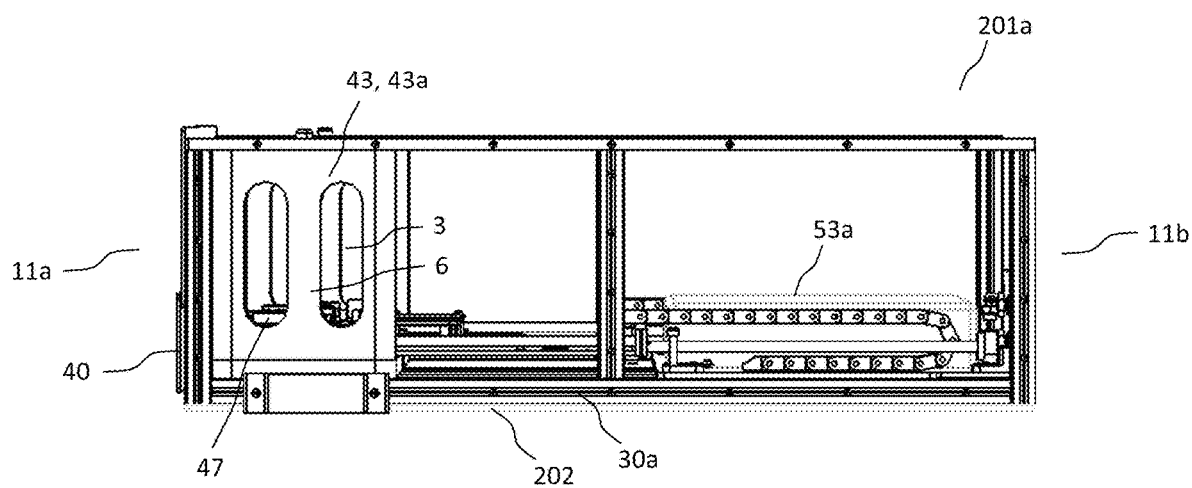
FIG. 2C shows a side view of a first housing part of the compact tester of FIG. 2A according to various embodiments.
Figure 2D:
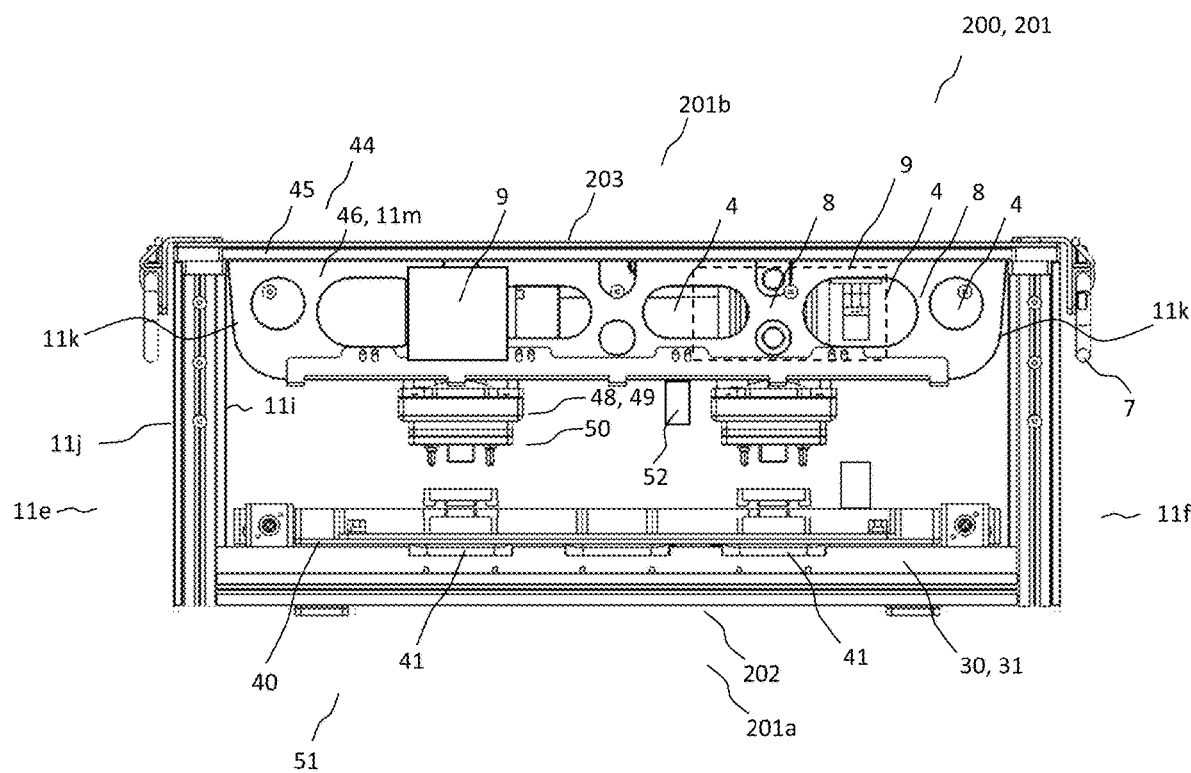
FIG. 2D shows a front view of a compact tester of FIG. 2A with the housing in the assembled configuration according to various embodiments.
Figure 2E:
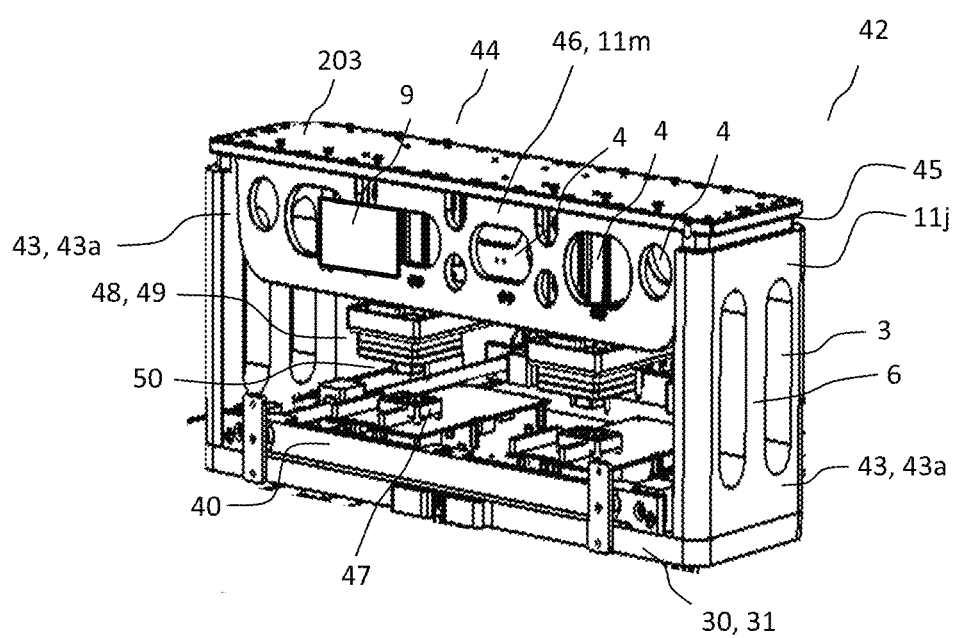
FIG. 2E shows a close-up perspective view of a reinforcement arrangement of the compact tester of FIG. 2A according to various embodiments.
Figure 2F:
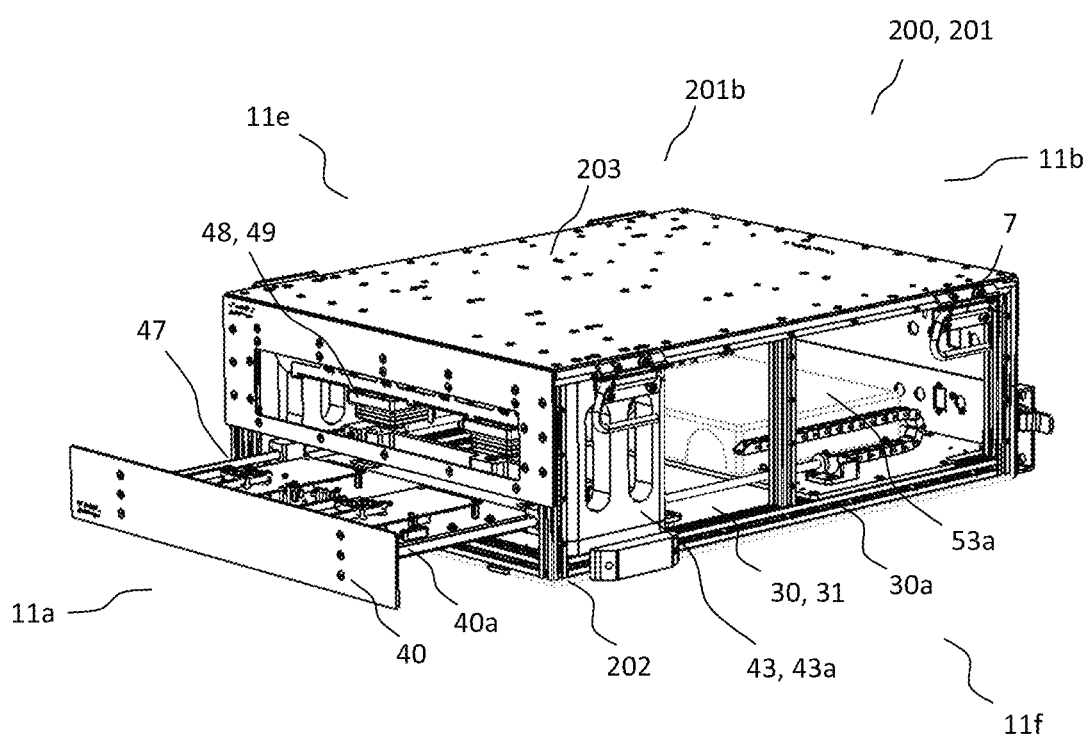
FIG. 2F shows a front perspective view of the compact tester of FIG. 2A with the drawer in an extended position according to various embodiments.
Figure 2G:
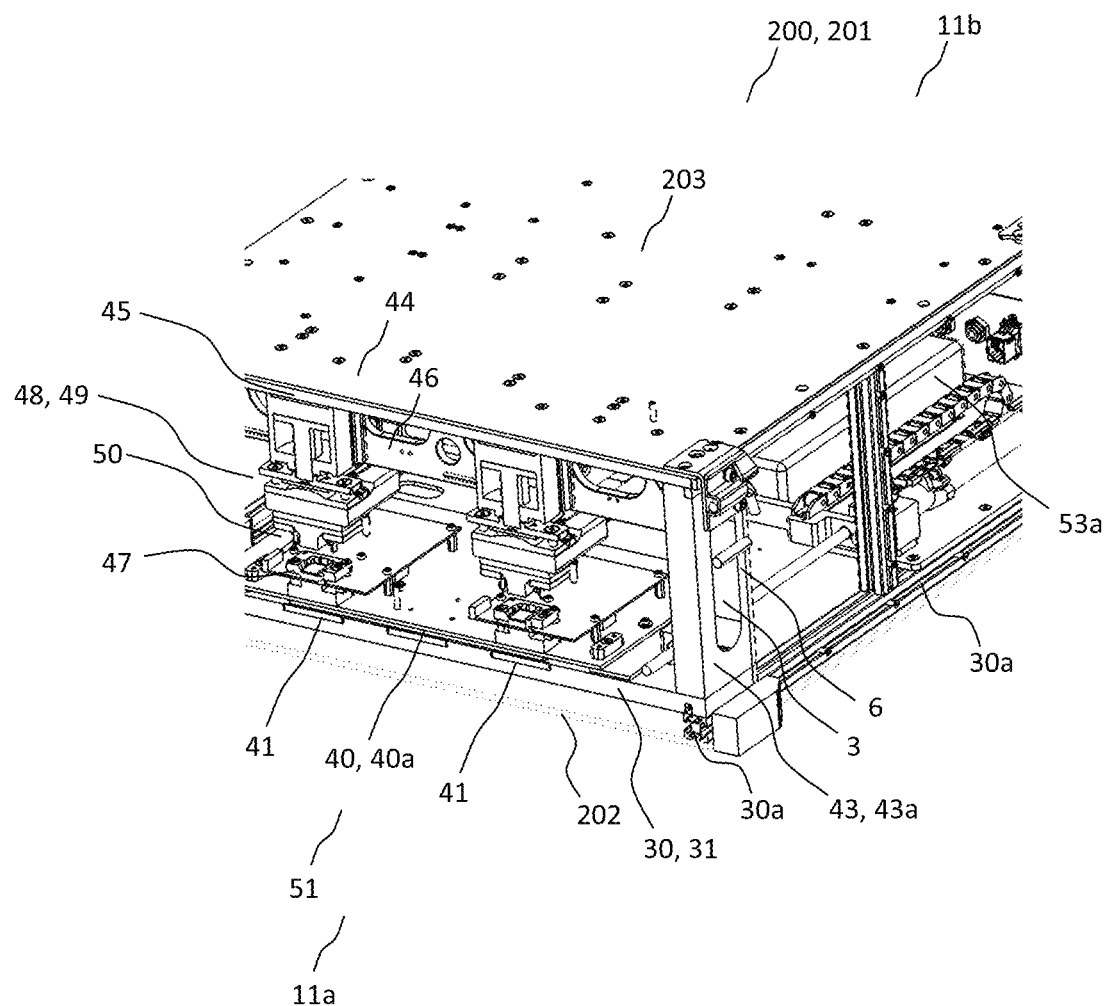
FIG. 2G shows a partial perspective view of the compact tester of FIG. 2A with the drawer and support slab according to various embodiments.

According to various embodiments, the base reinforcing panel 31 may be coupled to and spaced apart from the base plate 102 by a beam 30a (e.g. of a chassis or a frame) (see FIG. 2G).

According to various embodiments, the upright reinforcement sub-arrangement 13, the roof reinforcement sub-arrangement 14 and the base reinforcement sub-arrangement 30 may be interconnected to form the reinforcement arrangement 12 which reinforce and/or strengthen the housing 101 so as to enable the compact tester 100 to be capable of withstanding the force or load during testing while allowing the compact tester 100 to be of a reduced/compact size.

According to various embodiments, the pair of parallel reinforcing side walls 13a of the upright reinforcement sub-arrangement 13 may be extending upright from opposite edges 11e, 11f of the base reinforcing panel 31 of the base reinforcement sub-arrangement 30. According to various embodiments, the pair of parallel reinforcing side walls 13a of the upright reinforcement sub-arrangement 13 may be coupled to the base reinforcing panel 31 of the base reinforcement sub-arrangement 30 in a manner so as to be erected upright with respect to the base reinforcing panel 31. According to various embodiments, the pair of parallel reinforcing side walls 13a of the upright reinforcement sub-arrangement 13 may be integrally coupled or joined to the base reinforcing panel 31 of the base reinforcement sub-arrangement 30. According to various embodiments, the pair of parallel reinforcing side walls 13a of the upright reinforcement sub-arrangement 13 and the base reinforcing panel 31 of the base reinforcement sub-arrangement 30 may be integrally molded or casted or printed or formed.

According to various embodiments, the base reinforcing panel 31 of the base reinforcement sub-arrangement 30 may be of an elongated shape having an elongated flat surface which is attached flat against the base plate 102. According to various embodiments, the base reinforcing panel 31 of the base reinforcement sub-arrangement 30 may be of a rectangular shape and may have a rectangular flat surface attached flat against the base plate 102. According to various embodiments, the base reinforcing panel 31 may be coupled to and spaced apart from the base plate 102 by a beam 30a (e.g. of a chassis or a frame) (see FIG. 2G). According to various embodiments, the base reinforcing panel 31 of the base reinforcement sub-arrangement 30 in the elongated shape may be positioned longitudinally across opposite edges (or lateral edges) of the base plate 102.

According to various embodiments, the reinforcement arrangement 12 may always include the upright reinforcement sub-arrangement 13 and the roof reinforcement sub-arrangement 14. However, the reinforcement arrangement 12 may or may not include the base reinforcement sub-arrangement 30. According to various embodiments, the reinforcement arrangement 12 including at least the upright reinforcement sub-arrangement 13 (i.e. the reinforcing side walls 13a at the bottom assembly or the first housing part 101a) and the roof reinforcement sub-arrangement 14 (i.e. the top assembly reinforcement structure) may form a rigid structure to support a plunge force that happen in between the roof plate 103 and the base plate 102 (or the top and bottom assembly; or the first and second housing parts 101a, 101b). According to various embodiments, the frame of the reinforcement arrangement 12 itself also maintains the structure tolerances in good shape. According to various embodiments, the roof reinforcement sub-arrangement 14 (or the reinforcement structures on top part of the test cell) plays an important role in resisting any deformation of roof plate 103 of the housing 100 as a result of continuous actuation of the one or more DUT press units 18. According to various embodiments, all of these reinforcement structures may be built in the housing 101 of a single cell (instead of in a tester column in the conventional setup) to provide an easy and flexible handling of the compact tester 100 while still maintaining the test cell's construction stability and accuracy. Thus, the compact tester 100 of the various embodiments may be used as a standalone apparatus or used together with a test handler by docking it in a tester column or rack.

With reference to FIG. 1G, when the at least one actuator 19 is actuated to exert a force against the first housing part 101a and the second housing part 101b, the elongated reinforcing rib portion 16 of the roof reinforcement sub-arrangement 14 may reinforce or support the roof plate 103 and prevent a displacement (e.g. bending, bowing or buckling) of the roof plate 103, thereby maintaining the structural integrity of the housing 101 to provide an operational and functional compact-sized tester (e.g. test cell) 100 for testing an electronic device (i.e. DUT). In contrast, as an illustration, if the roof reinforcement sub-arrangement 14 is not present, the actuated actuator 19 may bend or arc the roof plate 103 of the first housing part 101a.

According to various embodiments, the compact tester 100 (or the test setup) may be joined together accurately with engagement and alignment elements 21a, 21b, for example including but not limited to, locating pins and fastener, as shown in 1G. According to various embodiments, when the second housing part 101b together with the roof reinforcement sub-arrangement 14 (i.e. top part) of the compact tester 100 is placed on and above the assembly of the first housing part 101a and the upright reinforcement sub-arrangement 13 (i.e. the bottom assembly), the engagement and alignment elements 21a, 21b, such as pins, may guide the position of the roof reinforcement sub-arrangement 14 to upright reinforcement sub-arrangement 13. These engagement and alignment elements 21a, 21b may enable a good positional match of the DUT press unit 18 with the contact head 20 (or thermal head) to the DUT test socket 17.

According to various embodiments, each upright reinforcement sub-arrangement 13 may include a respective first engagement element 21a. For example, the first engagement element 21a may be disposed at a top surface of the upright reinforcement sub-arrangement 13. According to various embodiments, the first engagement and alignment element 21a may include an exterior or interior screw threads (e.g. right-handed threads), a magnetic coupling member, a pin or a recess/hole of a pin-and-recess/hole coupling, or tongue and groove joint, or any other suitable coupling element or member that is adapted or configured to couple to a corresponding engagement element (for example, a second engagement element 21b) of the roof reinforcement sub-arrangement 14 to form a connection (e.g. joint) that detachably connects (or secures) the upright reinforcement sub-arrangement 13 and the roof reinforcement sub-arrangement 14 together, such that movement of the roof reinforcement sub-arrangement 14 is restrained along at least along a lateral direction of the housing 101 with respect to the upright reinforcement sub-arrangement 13.

According to various embodiments, each roof reinforcement sub-arrangement 14 may include a respective second engagement and alignment element 21b. For example, the second engagement element 21b may be disposed on the region of the surface of the reinforcing panel portion 15 of the roof reinforcement sub-arrangement 14, which is opposite the contact surface of the reinforcing panel portion 15, which may engage the top of the upright reinforcement sub-arrangement 13. According to various embodiments, the second engagement and alignment element 21b may include exterior or interior screw threads (e.g. right-handed threads), a magnetic coupling member, a pin or a recess/hole of a pin-and-recess/hole coupling, or a tongue and groove joint, or any other suitable coupling element or member that is adapted or configured to couple to the first engagement element 21a of the upright reinforcement sub-arrangement 13 to form a connection (e.g. joint) that detachably connects (or secures) the upright reinforcement sub-arrangement 13 and the roof reinforcement sub-arrangement 14 together, such that movement of the roof reinforcement sub-arrangement 14 is restrained along at least along a lateral direction of the housing 101 with respect to the upright reinforcement sub-arrangement 13.

According to various embodiments, when the roof reinforcement sub-arrangement 14 and the upright reinforcement sub-arrangement 13 are interconnected to each other, the first engagement and alignment element 21a of the upright reinforcement sub-arrangement 13 may engage the second engagement and alignment element 21b of the roof reinforcement sub-arrangement 14 to prevent the reinforcing panel portion 15 of the roof reinforcement sub-arrangement 14 from displacement (e.g. sliding) with respect to the upright reinforcement sub-arrangement 13.

According to various embodiments, the first engagement and alignment element 21a may include a guide pin on the top surface of each upright reinforcement sub-arrangement 13, and the second engagement and alignment element 21b may include at least one corresponding recess (or groove) on a corresponding region of the reinforcing panel portion 15 of the roof reinforcement sub-arrangement 14 for receiving the guide pin(s) respectively. According to various embodiments, the first and second engagement and alignment element 21a, 21b may be reversed, whereby the second engagement and alignment element 21b may include at least one guide pin and the first engagement and alignment element 21a may include at least one corresponding recess.

According to various embodiments, when the second housing part 101b (e.g. top part of the housing 101) is placed on (or is placed above) the first housing part 101a (e.g. bottom part of the housing 101), the first and second engagement and alignment element 21a, 21b in the form of guide pins (or pins) or recesses may guide the assembly of the second housing part 101b and the roof reinforcement sub-arrangement 14 to be aligned with the assembly of the first housing part 101a and the upright reinforcement sub-arrangement 13. Accordingly, this may ensure good positional match or alignment of respective contact head 20s to sockets of the DUT test socket 17.

According to various embodiments, the compact tester 100 may further include an electronic control arrangement 23.

According to various embodiments, the electronic control arrangement 23 may include a first controller 23a coupled to the base plate 102 of the first housing part 101a. For example, when the DUT test sockets 17 are disposed towards the front of the housing 101, the first controller 23a may be positioned adjacent to the DUT test socket 17 and along the base plate 102 towards the rear of the housing 101.

According to various embodiments, the electronic control arrangement 23 may include a second controller 23b coupled to the roof plate 103 of the second housing part 101b. For example, when the DUT press units 18 are disposed towards the front of the housing 101, the second controller 23b may be positioned adjacent to the DUT press units 18 at the roof plate 103 and along the roof plate 103 and towards the rear of the housing 101.

According to various embodiments, the first controller 23a may be in data and/or electrical communication with the DUT test socket 17. According to various embodiments, the first controller 23a may include a test controller. According to various embodiments, the first controller 23a may control a test program run in a DUT plugged into the DUT test socket 17. According to various embodiments, the first controller 23a may be adapted to control or adjust a test parameter of the DUT test socket 17.

According to various embodiments, the second controller 23b may be in data and/or electrical communication with the one or more DUT press units 18 and/or the contact head 20 (e.g. thermal head). According to various embodiments, the second controller 23b may include a DUT press unit 18 controller and/or a thermal controller. According to various embodiments, the second controller 23b may be configured to control or adjust a test parameter of the one or more DUT press units 18 and/or a test parameter of the contact head 20 (e.g. thermal head). According to various embodiments, the test parameter of the one or more DUT press units 18 may include a movement of the contact head 20 of the DUT press unit 18 and/or an amount of DUT press unit 18 force and/or a duration of press to be executed. According to various embodiments, the test parameter of the contact head 20 (e.g. thermal head) may include a temperature or varying temperature cycle applied or provided by the contact head 20 and/or a duration of temperature control to be executed.

According to various embodiments, the electronic control arrangement 23 may include a first connector 24a coupled or connected to the first controller 23a and a second connector 24b coupled to the second controller 23b. According to various embodiments, the first connector 24a and the second connector 24b may be coupled to each other when the housing 101 is in the coupled configuration (i.e. assembled configuration).

According to various embodiments, the first connector 24a and the second connector 24b may be removably couplable to each other in a manner so as to electrically couple the first controller 23a (e.g. test controller) and the second controller 23b (e.g. DUT press unit controller) when the housing 101 is in the coupled configuration and to decoupled the first controller 23a (e.g. test controller) and the second controller 23b (e.g. DUT press unit controller) when the first housing part 101a and the second housing part 101b are separated (or decoupled) from each other.

According to various embodiments, the first and second connectors 24a, 24b may be blindmate connectors. For example, the first connector 24a may be a male blindmate connector and the second connector 24b may be a female blindmate connector, or the first connector 24a may be a female blindmate connector and the second connector 24b may be a male blindmate connector. According to various embodiments, since the first and second connectors 24a, 24b are blindmate connectors, each of the first and second connectors 24a, 24b may be connected to external device(s) for data and/or electrical and/or pneumatic communication when the first housing part 101a and the second housing part 101b are separated (or decoupled) from each other during maintenance of the compact tester 100.

According to various embodiments, during preventive or breakdown maintenance of the compact tester 100, power may also be individually supplied to each of the first and second housing parts 101a, 101b for troubleshooting. Thus, while the compact tester 100 is opened up (or split open) for troubleshooting, it may still be provided or supplied with power e.g. from an external power source.

FIG. 2A shows a front perspective view of a compact tester 200 with a housing 201 in the assembled (or coupled) configuration according to various embodiments; FIG. 2B shows a perspective view of the compact tester 200 of FIG. 2A with the housing 201 in the separated (or decoupled) configuration according to various embodiments; FIG. 2C shows a side view of a first housing part 201a of the compact tester 200 of FIG. 2A according to various embodiments; FIG. 2D shows a front view of the compact 200 tester of FIG. 2A in the assembled configuration according to various embodiments; and FIG. 2E shows a close-up perspective view of a reinforcement arrangement 42 of the compact tester 200 of FIG. 2A according to various embodiments.

According to various embodiments, the compact tester 200 may be test setup that can be used to carry out various types of test, including burn-in test, functional test, or system level test, depending on how the compact tester 200 is set up. According to various embodiments, the footprint of the compact tester 200 may be less than 800 mm×500 mm×300 mm and may weigh less than 50 kg. For example, a prototype of the compact tester 200 has a footprint of or preferably 720 mm×550 mm×222 mm and weighs around 40 kg. According to various embodiments, the compact tester 200 may include or consist essentially of two sections, which are the top assembly and bottom assembly. According to various embodiments, the top assembly may include a second housing part 201b having a roof plate 203. The second housing part 201b may house the DUT press units with contact heads (or thermal heads), reinforcement structures forming the roof reinforcement sub-arrangement 44, fluid supply system 70 and thermal controller serving as the second controller 53b. On the other hand, the bottom assembly may include a first housing part 201a having a base plate 202. The first housing part 201a may house the test board or DUT test sockets 47, reinforcement structure forming the upright reinforcement sub-arrangement 43 for connecting to the roof reinforcement sub-arrangement 44, and a test controller serving as the first controller 53a. When the top assembly and the bottom assembly are put together, the compact tester 200 may form a compact functional test cell which works well with a test handler or as a standalone apparatus.

According to various embodiments, the compact tester 200 may, likewise to the compact tester 100 of FIG. 1A to FIG. 1G, include a housing 201 having the first housing part 201a and the second housing part 201b. According to various embodiments, the first housing part 201a may, likewise to the compact tester 100 of FIG. 1A to FIG. 1G, include the base plate 202. According to various embodiments, the second housing part 201b may, likewise to the compact tester 100 of FIG. 1A to FIG. 1G, include the roof plate 203. According to various embodiments, the compact tester 200 may, likewise to the compact tester 100 of FIG. 1A to FIG. 1G, include the reinforcement arrangement 42. According to various embodiments, the reinforcement arrangement 42, may likewise to the compact tester 100 of FIG. 1A to FIG. 1G, include the upright reinforcement sub-arrangement 43 and the roof reinforcement sub-arrange-ment 44. According to various embodiments, the roof reinforcement sub-arrangement 44, may likewise to the compact tester 100 of FIG. 1A to FIG. 1G, include a reinforcing panel portion 45 and an elongated reinforcing rib portion 46. According to various embodiments, the compact tester 200 may, likewise to the compact tester 100 of FIG. 1A to FIG. 1G, include at least one DUT test socket 47. According to various embodiments, the compact tester 200 may, likewise to the compact tester 100 of FIG. 1A to FIG. 1G, include one or more DUT press units 48 having an actuator 49 and contact head 50. According to various embodiments, the compact tester 200 may, likewise to the compact tester 100 of FIG. 1A to FIG. 1G, include the first engagement element 21a and the second engagement element 21b. According to various embodiments, the compact tester 200 may, likewise to the compact tester 100 of FIG. 1A to FIG. 1G, include an electronic control arrangement 53. As shown, likewise to the compact tester 100 of FIG. 1A to FIG. 1G, the electronic control arrangement 53 may include the first controller 53a (e.g. test controller) and the second controller 53b (e.g. DUT press unit controller and/or a thermal controller). According to various embodiments to various embodiments, the compact tester 200 may, likewise to the compact tester 100 of FIG. 1A to FIG. 1G, include the first connector 24a and the second connector 24b.

According to various embodiments, the compact tester 200 of FIG. 2A to FIG. 2E may contain all the features of the compact tester 100 of FIG. 1A to FIG. 1G. Accordingly, all features, changes, modifications, and variations that are applicable to the compact tester 100 of FIG. 1A to FIG. 1G may also be applicable to the compact tester 200 of FIG. 2A to FIG. 2E. According to various embodiments, the compact tester 200 of FIG. 2A to FIG. 2E may further include the following additional features and/or limitations.

As shown in FIG. 2C and FIG. 2D, the upright reinforcement sub-arrangement 43 of the reinforcement arrangement 42 of the compact tester of 200 may include a pair of opposing and/or parallel reinforcing side walls 43a.

According to various embodiments, the upright reinforcement sub-arrangement 43 may be disposed at the front portion 11a of the first housing part 201a of the housing 201. Accordingly, the upright reinforcement sub-arrangement 43 may be arranged (or positioned) at the front portion 11a of housing 201. Similarly, the roof reinforcement sub-arrangement 44 may be disposed at the front portion 11a of the second housing part 201b of the housing 201. Accordingly, the roof reinforcement sub-arrangement 44 may be arranged (or positioned) at the front portion 11a of housing 201. Therefore, the reinforcement arrangement 42 of the compact tester 200 may reinforce and strengthen the front portion 11a of the housing 201. Accordingly, the reinforcement arrangement 42 of the compact tester 200 may line the interior of the front portion 11a of the housing 201 so as to surround a region of the enclosed space of at the front portion 11a of the housing 201 in which the one or more DUT press units 48 may be disposed. Accordingly, the reinforcement arrangement 42 may strengthen the front portion 11a of the housing 201 which may be subjected to the plunge force or the actuation force from the one or more DUT press units 48

Referring to FIG. 2C, according to various embodiments, each reinforcing side wall 43a of the upright reinforcement sub-arrangement 43 may include at least one through-holes 3 (or opening) extending between the inwardly directed lateral surface (or inner surface) 11i and the outwardly directed lateral surface (or outer surface) 11j of the reinforcing side wall 43a of the upright reinforcement sub-arrangement 43. As shown in FIG. 2C, each reinforcing side wall 43a of the upright reinforcement sub-arrangement 43 may include two or at least two (i.e. a plurality of) through-holes 3. According to various embodiments, the plurality of through-holes 3 may be uniformly spaced apart, in other words, each through-hole 3 of the plurality of through-holes 3 may be uniformly spaced apart from an adjacent or neighboring through-hole 3. According to various embodiments, the plurality of first set of through-holes 3 may be identical in size to each other. According to various embodiments, the plurality of through-holes 3 may be distributed along the longitudinal axis of the housing 101. According to various embodiments, each through-hole 3 may include an elongated shape cross-sectional hole profile. According to various embodiments, the elongated shape cross-sectional hole profile of each through-hole 3 may be aligned vertically with respect to the corresponding reinforcing side wall 43a.

According to various embodiments, each reinforcing side wall 43a of the upright reinforcement sub-arrangement 43 may include a divider portion 6 between or separating a pair (or each pair) of adjacent through-holes 3. In other words, each reinforcing side wall 43a may include a pair of through-holes 3 in a side-by-side arrangement with a divider portion 6 of the reinforcing side wall 43a separating the pair of through-holes 3 laterally. As shown in FIG. 2C, according to various embodiments, the divider portion 6 may be extending vertically along the reinforcing side wall 43a.

Referring to FIG. 2D, according to various embodiments, the elongated reinforcing rib portion 46 of the roof reinforcement sub-arrangement 44 of the compact tester 200 may include at least one through-hole 4 extending between the planar surface 11m of the elongated reinforcing rib portion 46 facing the front 11a of the housing 201 and the planar surface 11m of the elongated reinforcing rib portion 46 facing the rear 11b of the housing 201. As shown in FIG. 2D, the elongated reinforcing rib portion 46 may include at least two or a plurality through-holes 4. According to various embodiments, the plurality of through-holes 4 may be uniformly spaced apart, in other words, each through-hole 4 of the plurality of through-holes 4 may be uniformly spaced apart from an adjacent or neighboring through-hole 4. According to various embodiments, the plurality of through-holes 4 may be distributed along the longitudinal direction of the elongated reinforcing rib portion 46. According to various embodiments, each through-hole 4 of the plurality of through-holes 4 may include an elongated shape cross-sectional hole profile. According to various embodiments, the elongated shape cross-sectional hole profile may be aligned to the longitudinal direction of the elongated reinforcing rib portion 46. According to various embodiments, the elongated reinforcing rib portion 46 may include a divider portion 8 between or separating adjacent through-holes 4 of the plurality of through-holes 4. As shown in FIG. 2D, according to various embodiments, the divider portion 8 of the roof reinforcement sub-arrangement 44 may extend vertically across a width of the elongated reinforcing rib portion 46.

As shown in FIG. 2D, according to various embodiments, the elongated reinforcing rib portion 46 of the roof reinforcement sub-arrangement 44 may be shaped such that the longitudinal ends 11k of the elongated reinforcing rib portion 46 may be chamfered or tapered or slanted (e.g. non-perpendicular). According to various embodiments, the longitudinal ends 11k of the elongated reinforcing rib portion 46 may be chamfered or tapered or slanted or angled towards each other in a direction along the width of the elongated reinforcing rib portion 46 and away from the reinforcing panel portion 45 of the roof reinforcement sub-arrangement 44.

According to various embodiments, with the housing 201 in the assembled configuration, the divider portion 6 of each reinforcing side wall 43a may be aligned (e.g. in line) with a position of the one or more DUT press units 48. In other words, the divider portion 6 and the one or more DUT press units 48 may be positioned or arranged in a straight row when the housing 201 is in the assembled configuration. According to various embodiments, each DUT press unit 48 of the one or more DUT press units 48 may be positioned between and may be aligned with the divider portions 6 of the pair of reinforcing side wall 43a. In other words, according to various embodiments, each DUT press unit 48 may be positioned between the divider portion 6 of the first reinforcing side wall 43a and the divider portion 6 of the second reinforcing side wall 43a. Accordingly, according to various embodiments, the divider portion 6 of the first reinforcing side wall 43a, the divider portion 6 of the second reinforcing side wall 43a, and the DUT press unit 48 may be aligned along a straight line (or path) parallel to lateral direction of the housing 201.

According to various embodiments, with the through-holes 3 in the reinforcing side wall 43a of the upright reinforcement sub-arrangement 43 and the through-holes 4 in the elongated reinforcing rib 46 of the roof reinforcement sub-arrangement 44, a lightweight compact-sized tester that is operational and functional may be provided. According to various embodiments, the configuration of the through-holes 3 as well as the through-holes 4 may reduce the weight while not compromising on the reinforcement and strengthening effect of the upright reinforcement sub-arrangement 43 and the roof reinforcement sub-arrangement 44.

According to various embodiments, the compact tester 200 may further include at least one local controller circuit board 9, e.g. printed circuit board (PCB).

According to various embodiments, the local controller circuit board 9 may be provided in the second housing part 201b. For example, according to various embodiments, the local controller circuit board 9 may be affixed or directly coupled to (or attached to and/or engaged with and/or contacting) the elongated reinforcing rib portion 46 of the roof reinforcement sub-arrangement 44 at the second housing part 201b. According to various embodiments, the roof reinforcement sub-arrangement 44 may be provided with at least one local controller circuit board 9 coupled to the elongated reinforcing rib portion 46 (e.g. to planar surface 11m) of the roof reinforcement sub-arrangement 44.

According to various embodiments, the local controller circuit board 9 may be in communication (e.g. electrical and/or data and/or signal etc., or electrically coupled) with the second controller 53b, the DUT press unit 48 and the contact head 50. According to various embodiments, the local controller circuit board 9 may receive instructions from the second controller 53b and control the DUT press unit 48 as well as the contact head 50.

FIG. 2F shows a front perspective view of the compact tester 200 of FIG. 2A with a drawer 40 in an extended position according to various embodiments; FIG. 2G shows a partial perspective view of the compact tester 200 of FIG. 2A with the drawer 40 and support slab or block 41 according to various embodiments.

According to various embodiments, the compact tester 200 may further include a drawer 40 (e.g. retractable drawer 40 or sliding drawer 40) coupled to the housing 201 in a manner so as to be retractably movable and extendably movable relative to the housing 201 of the compact tester 200. Accordingly, the drawer 40 may be slidably retractable and extendable relative to the housing 201 between an extended position and a retracted position. According to various embodiments, in the extended position, the drawer may be extended out of the housing 201. According to various embodiments, in the retracted position, the drawer may be inserted into the space between the roof plate 203 and the base plate 202 of the housing 201. According to various embodiments, the drawer 40 may be coupled to the first housing part 201*a* in a manner so as to be retractable and extendable between the extended position and the retracted position with respect to the first housing part 201*a*.

According to various embodiments, the drawer 40 may include a base panel 40*a* having a drawer surface (e.g. top surface or upper surface) and an underneath surface (e.g. bottom surface or lower surface) opposite the drawer surface. According to various embodiments, the DUT test socket 47 may be disposed on the drawer surface of the drawer 40.

According to various embodiments, the reinforcement arrangement 42 may further include a drawer reinforcement sub-arrangement 51 having one or more support slabs (or blocks) 41 disposed on the base plate 202 of the first housing part 201*a*. Accordingly, the one or more support slabs 41 may be between the underneath surface of the base panel 40*a* of the drawer 40 and the base plate 202 of the housing 201. Further, according to various embodiments, the one or more support slabs 41 may be aligned between the pair of reinforcing sidewalls 43*a* of the upright reinforcement sub-arrangement 43.

According to various embodiments, a distance (e.g. of a gap) between the underneath surface of the drawer 40 and the top surface of the one or more support slabs 41 may be negligible as compared to a distance between the underneath surface of the drawer 40 and the upper surface of the base plate 202 when the drawer 40 is in the retracted position.

According to various embodiments, each support slab 41 protrudes upwards with respect to the base plate 202 in a manner such that each support slab 41 may abut the underneath surface of the drawer 40 when the drawer 40 is in the retracted position. Accordingly, according to various embodiments, a height of the top surface of the support slab 41 measured from the upper surface of the base plate 202 may be equal to a height between the underneath surface of the drawer 40 and the upper surface of base plate 202.

According to various embodiments, the one or more support slabs 41 may be separate elements or entities and may be detachably attached to the base plate 202. According to various embodiments, the base plate 202 may include at least one recess portion for receiving a corresponding support slab 41 therein.

According to various embodiments, the compact tester 200 may include a number of support slabs 41 that is equal to or more than a number of one or more DUT press units 48.

According to various embodiments, when the reinforcement arrangement 42 includes the base reinforcement sub-arrangement 30, the drawer reinforcement sub-arrangement 51 may be disposed on the base reinforcement sub-arrangement 30. As shown in FIG. 2G, the base reinforcing panel 31 of the base reinforcement sub-arrangement 30 may be coupled to the base plate 202 via a beam 30*a* between the base reinforcing panel 31 and the base plate 202. Accordingly, the one or more support slabs 41 of the drawer reinforcement sub-arrangement 51 may be disposed on the base reinforcing panel 31 of the base reinforcement sub-arrangement 30. According to various embodiments, the base reinforcing panel 31 of the base reinforcement sub-arrangement 30 may include at least one recess portion for receiving a corresponding support slab 41 therein.

According to various embodiments, with the housing 201 in the assembled configuration, when the drawer 40 is in the retracted position, each support slab 41 may be aligned (e.g. sharing a common axial axis) with a corresponding DUT test socket 47 and a corresponding DUT press unit 48 to strengthen and reinforce the base panel of the drawer so as to prevent a displacement (e.g. deformation, bending or warping etc.) of the base panel of the drawer 40 when the actuator 49 of the DUT press unit 48 is actuated to exert a force on a DUT plugged into the DUT test socket 47 on the drawer 40.

According to various embodiments, the compact tester 200 may further include a position sensor 52 (represented in FIG. 2D) within the housing 201. According to various embodiments, the position sensor 52 may be configured to detect whether the drawer 40 is in an extended position or a retracted position. According to various embodiments, the position sensor 52 may be in data and/or electrical communication with the second controller 53*b* of the electronic control arrangement 53. According to various embodiments, the second controller 53*b* of the electronic control arrangement 53 may be configured to prevent or stop the one or more DUT press units 48 from moving the corresponding contact head 50 when the position sensor 52 detects that the drawer 40 is in an extended position (i.e. not in the retracted position).

Figure 2H:
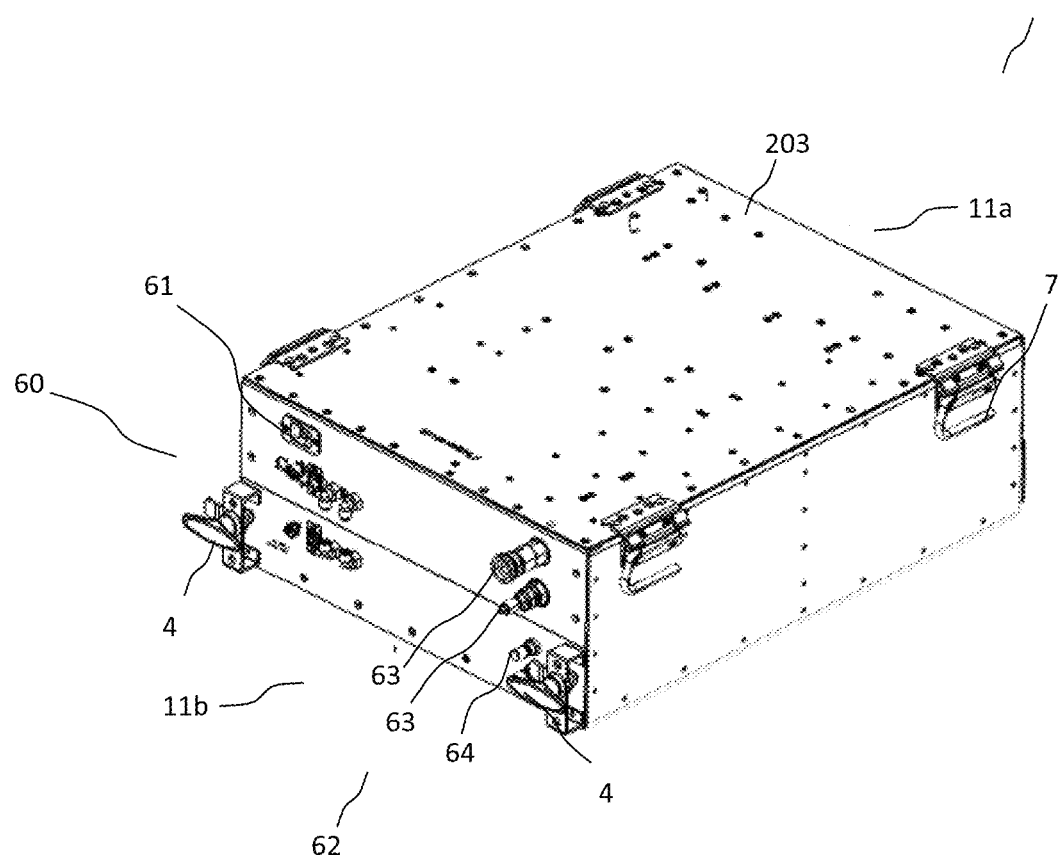
FIG. 2H shows a rear perspective view of the compact tester of FIG. 2A according to various embodiments.

FIG. 2H shows a rear perspective view of the compact tester 200 of FIG. 2A according to various embodiments.

According to various embodiments, the compact tester 200 may include quick-connect fittings for both air and coolant connections, which may provide easy and convenient connection to direct supplies, such as an air tank or an air pump or a coolant tank, or an external test handler. With air supply from an air tank or an air pump, the compact tester 200 may be functional even if it is operated without the external test handler. According to various embodiments, the compact tester 200 may include a power socket which can power up the compact tester 200 by connecting to a power source from a wall socket. According to various embodiments, the same type of power connection may be available on the external test handler which makes the compact tester 200 also functional when docked into a tester rack of the external test handler. According to various embodiments, when coolant supply is not available, the compact tester 200 may be used with a fan for cooling, or running without active temperature control. According to various embodiments, when the compact tester 200 is docked to the external test handler, the compact tester 200 may enable automation by receiving commands from the external test handler and executing them. The compact tester 200 may also report the result of the test and other information of activity that occurred in the compact tester 200.

According to various embodiments, the housing 201 of the compact tester 200 may include an interface 60 on the housing 201. The interface may be on an external surface of the housing 201.

According to various embodiments, the interface 60 may include a power socket 61, serving as a power quick connection fitting, in electrical communication with the electronic control arrangement 53 of the compact tester 200. According to various embodiments, the compact tester 200 may be supplied with power from an external power source, for example, from a wall socket (e.g. residential/office wall socket or normal socket) or from a power source of an external test handler system when the compact tester 200 is docked into the external test handler system), via the power socket 61 of the interface 60.

According to various embodiments, the interface 60 may further include at least one fluid (e.g. liquid, air etc.) socket 62 (e.g. coolant connector 63, air/pneumatic connector 64 etc.) which serves as a fluid quick connection fitting. According to various embodiments, the compact tester 200 may be supplied with coolant and/or air from an external fluid source, for example, from the external test handler system when the compact tester 200 is docked into the external test handler system or from a fluid source (e.g. fluid tanks) which is separate and independent from the external test handler system, via the at least one fluid socket 62.

Accordingly, according to various embodiments, with fluid (e.g. supply) from an independent fluid source, the compact tester 200 may be functional even if it is operated without being docked to the external test handler system.

Figure 3A:
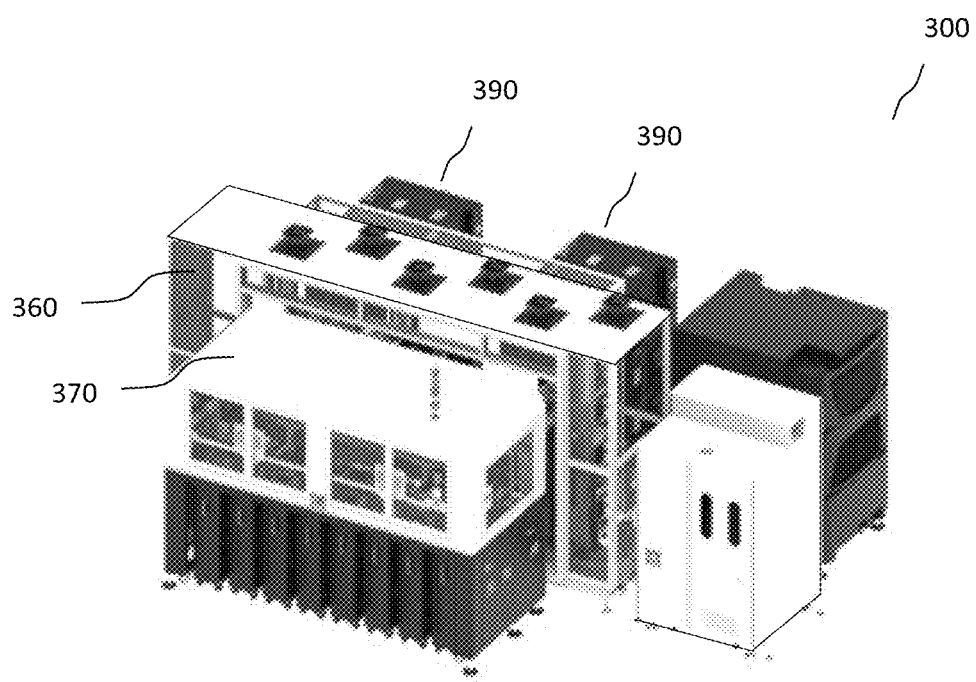
FIG. 3A shows a perspective view of a test handler system with the a tester rack docked to a unit handling module according to various embodiments.
Figure 3B:
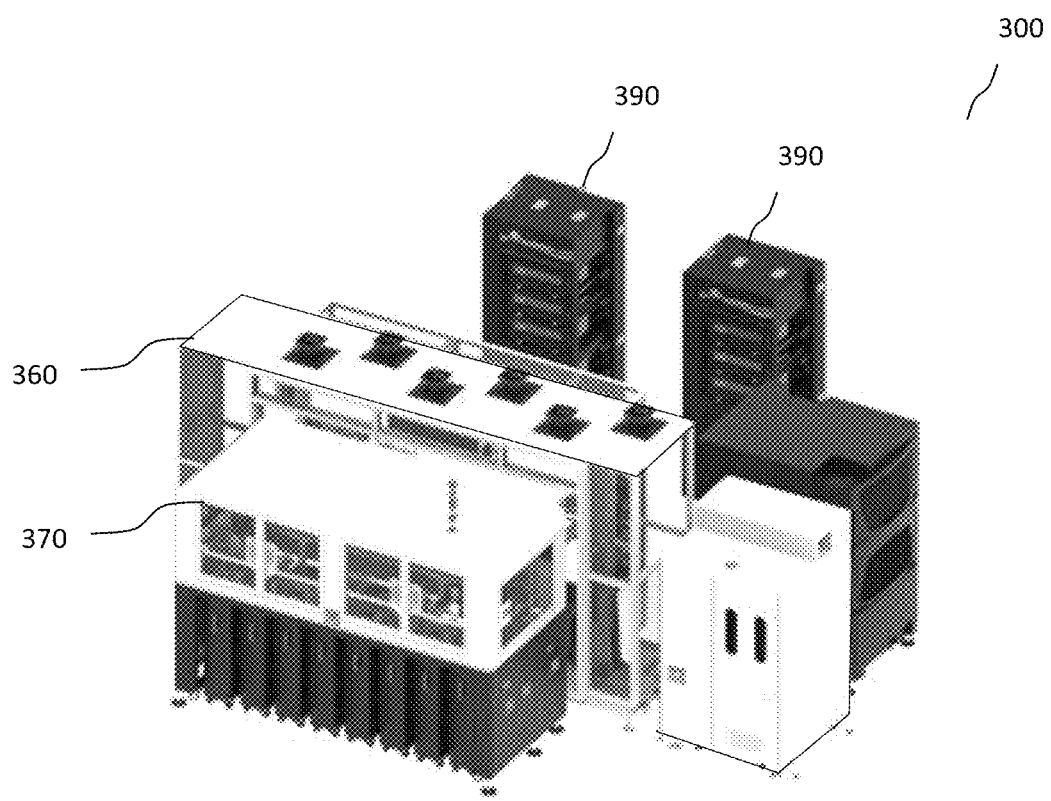
FIG. 3B shows a perspective view of a test handler system with the a tester rack undocked from the unit handling module according to various embodiments.
Figure 3C:
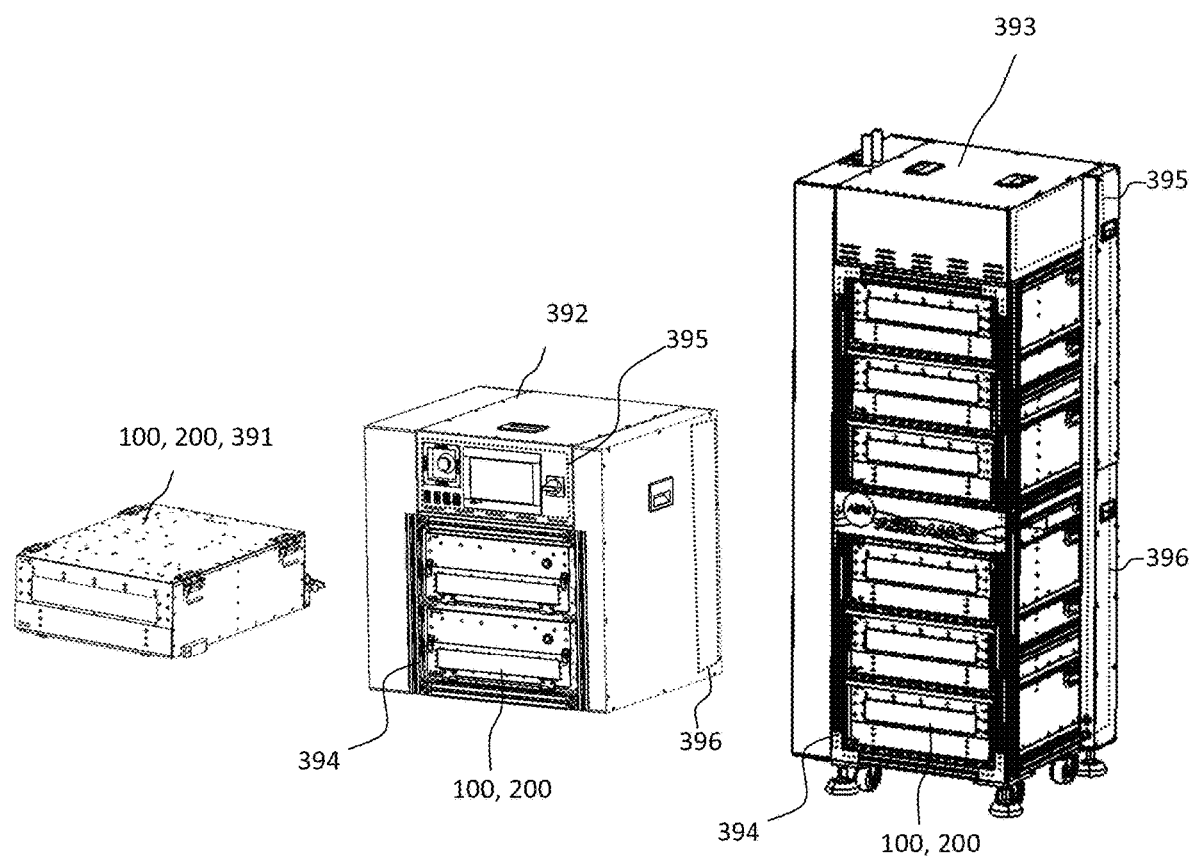
FIG. 3C shows perspective views of exemplary tester racks according to various embodiments.
Figure 3D:
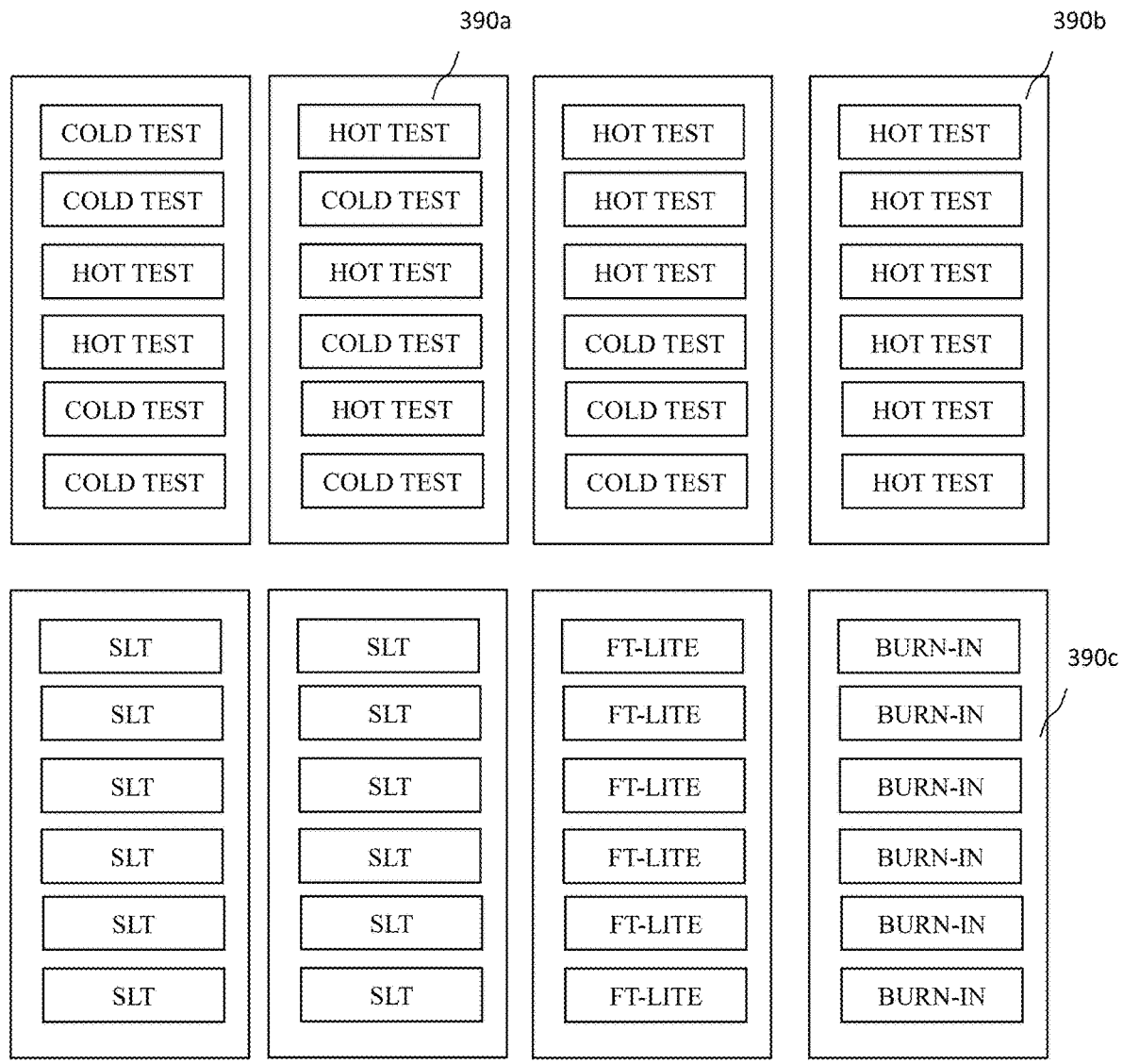
FIG. 3D shows a schematic diagram of individual test setups among a plurality of compact testers.

FIG. 3A shows a perspective view of a test handler system 300 with a tester rack 390 (or tester column) docked to a unit handling module 360 according to various embodiments; FIG. 3B shows a perspective view of a test handler system 300 with the tester rack 390 (or tester column) undocked from the unit handling module 360 according to various embodiments; FIG. 3C shows perspective views of exemplary tester racks 390a, 390b, 390c according to various embodiments; and FIG. 3D shows a schematic diagram of individual test setups among a plurality of compact testers.

According to various embodiments, a test handler system 300 may be provided.

According to various embodiments, the test handler system 300 may include a loader/unloader module 370 which may be coupled (or docked) to the unit handling module 360. The loader/unloader module 370 may be adapted to load new electronic devices to be tested and/or unload electronic devices which have been tested.

According to various embodiments, the test handler system 300 may include a unit handling module (e.g. handler) 360 for picking up and dropping off one or more electronic devices between the loader/unloader modules 370 and one or more compact testers 100, 200 in a tester rack 390 (or tester column).

According to various embodiments, the test handler system 300 may include one or more modular tester racks 390 (or tester columns) According to various embodiments, each tester rack 390 may be configured to receive (or hold) one or more compact testers 100, 200 (e.g. test cell) as described above. For example, with reference to FIG. 3C, the tester rack 390 may be adapted to hold a single compact tester 100, 200 (referred to as a single cell configuration of the tester rack 391), two compact testers 100, 200 (referred to as a dual-cells configuration of the tester rack 392 or "Engineering Model"), or a plurality (e.g. 6) compact testers 100, 200 (referred to as a "Production Model" of the tester rack 393). According to various embodiments, the tester rack 390 may be a vertical tester rack or column having one or two or more docking slots 394 arranged vertically to receive (or hold) a plurality of compact testers 100, 200 modularly stacked vertically therein.

According to various embodiments, the compact tester 100, 200 may be a single cell configuration or a single cell laboratory unit. The single cell configuration may be suitable for debugging purposes. The single cell configuration can be further scaled up by doubling the number of compact testers (e.g. test cells) to the dual-cell configuration or Engineering Model. For high volume manufacturing (e.g. process, testing etc.), a plurality of compact testers (e.g. test cells) can be stacked in a tester rack 390 (or column) in the Production Model. The Production Model may be provided or equipped with the necessary electrical connections (or supplies) as well as fluid connections (or supplies) for the plurality of compact testers (e.g. test cells) held in the Production Model tester rack 390.

Referring to FIG. 3A and FIG. 3B, according to various embodiments, a tester rack 390 having a plurality of compact testers 100, 200 docked therein may be coupled or docked to the unit handling module 360 on one side of the unit handling module 360. The loader/unloader module 370 may be coupled to the unit handling module 360 on another side of the unit handling module 360. Accordingly, the unit handling module 360 may pick up electronic devices from the loader/unloader module 370, dispose the electronic devices to (or into) the compact testers 100, 200 (e.g. test cells) for testing, displace the electronic devices away from the compact testers 100, 200 after testing, and unloading the electronic devices to the loader/unloader module 370.

Referring to FIG. 3D, according to various embodiments, the plurality of compact testers 100, 200 in each tester rack 390 may be independent from each other. According to various embodiments, different tester racks 390 may also have different arrangements of the plurality of compact testers 100, 200 for conducting different tests. Accordingly, the test setup of each compact tester 100, 200 (e.g. test cell) in each tester rack 390 may be independent (e.g. standalone) from the other compact testers in any of the one or more tester racks 390. As shown in FIG. 3D, different tester racks 390 may have different configurations of test setup with respectively docked compact testers 100, 200. For example, in a first tester rack 390a, some compact testers 100, 200 docked therein may be configured to perform hot test only while other compact testers 100, 200 docked therein may be configured to perform cold test only. As a further example, in a second test rack 390b, all the compact testers 100, 200 docked therein may be configured to perform respective standalone hot test only. As a further example, in a third test rack 390c, all the compact testers 100, 200 docked therein may be configured to perform respective standalone burn-in test only.

According to various embodiments, the tester rack 390, 390a, 390b, 390c, 392, 393 may include a distribution center 395 (see FIG. 3C, represented by a dotted box) for centralized processing and control of the plurality (or two or more) of compact testers 100, 200 docked in docking slots 394 of the tester rack 390, 390a, 390b, 390c, 392, 393. The distribution center 395 may also serve as a centralized supply of air, fluid or coolant to the plurality of compact testers 100, 200. According to various embodiments, the tester rack 390, 390a, 390b, 390c, 392, 393 may include a testers management arrangement 396 (see FIG. 3C, represented by a dotted box) coupled to the distribution center 395. According to various embodiments, the testers management arrangement 396 may include hardware components and devices connecting the distribution center 395 to each docking slots 394 of the tester rack 390, 390a, 390b, 390c, 392, 393 for connecting to the compact testers 100, 200. According to various embodiments, the hardware components may include, but not limited to, processors, circuits, router, distribution boards, as well as cables for distribution of data/electrical communications. According to various embodiments, the hardware components may also include, but not limited to, manifold, pipings, valves, regulator, pumps etc. for distribution of fluid, air and/or coolant. According to various embodiments, with the distribution center 395, the tester rack 390, 390a, 390b, 390c, 392, 393 may provide a single interface for controlling the plurality of compact testers 100, 200 docked in the docking slots 394 of the tester rack 390, 390a, 390b, 390c, 392, 393. According to various embodiments, the distribution center 395 may also enable the test handler system 300 to control the plurality of compact testers 100, 200 by interfacing with the distribution center 395.

According to various embodiments, multiple (i.e. a plurality of) compact testers 100, 200 may be operated with the unit handling module 360 (e.g. handler) of a test handler system 300. The multiple compact testers 100, 200 may be in parallel connection (e.g. electrical, data, signal etc. connection) with the unit handling module 360. According to various embodiments, any one of the compact testers 100, 200 can be disabled and removed from the test handler system 300 for offline troubleshooting while other compact testers 100, 200 remain in operation. This feature allows the test handler system 300 to continue its processes without being interrupted by maintenance or package change or test configuration change (e.g. of any one of the compact testers 100, 200) for a subsequent operation.

The configurability and scalability of the compact testers 100, 200 (e.g. test cells) and also the tester racks 390 results in the test handler system 300 being a highly modular system which may be configurable for optimal productivity and efficiency.

According to various embodiments, when respective one or more compact testers 100, 200 (e.g. test cells) are docked to the unit handling module 360 (e.g. via the tester rack 390), each respective compact tester 100, 200 may enables automation of testing (within the respective compact tester) by (i) receiving a command for a test from the unit handling module 360 of the test handler system 300, (ii) executing the command, and (iii) reporting the result of the test and other information related to any activity within the compacted tester 100, 200 to the unit handling module 360 of the test handler system 300.

According to various embodiments, when a compact tester 100, 200 is docked in the test handler system 300, the electronic control arrangement (e.g. test controller) of the compact tester 100, 200 may connect or enable communication between the compact tester 100, 200 (e.g. test board of the compact tester) and the unit handling module 360 of the test handler system 300. According to various embodiments, the electronic control arrangement (e.g. test controller) may be configured to control and coordinate all activities within the compact tester 100, 200. For example, the electronic control arrangement (e.g. test controller) may be configured to control the movement of all components (e.g. mechanical components) of the compact tester 100, 200, control all input and output electric signal to/from or within the compact tester 100, 200, communicate with the test board, execute test programs, and process test result etc. In other words, when the compact tester 100, 200 (e.g. test cell) is working with a unit handling module 360, the electronic control arrangement (e.g. test controller) of the compact tester 100, 200 connects to the unit handling module 360 and enables automation (e.g. of processes or testing of at least one DUT in the compact tester 100, 200).

Various embodiments have provided a compact tester that is portable, compact and lightweight. In various embodiments, the reinforcements structure stay within the compact tester and near to where the plunge force is applied. The reinforcement structure may be configured to be light, small and inexpensive. In various embodiments, by having a reinforcement arrangement (i.e. reinforcement structures) built in each compact tester (or cell), instead of within a test handler system or a tester column, an easy-to-use (e.g. portable, compact, lightweight) and flexible tester may be provided, while still maintaining (or retaining) the stability and accuracy (e.g. tolerance) required in a tester construction. Furthermore, as the reinforcement arrangement (i.e. reinforcement structures) is built in each compact tester (or cell), it is very easy to control the tolerances, thereby leading to reduced fabrication costs. Further, when used with a test handler system, the compact tester enables change of package related components to be done outside of the handler, for example, on a service desk with the compact tester opened. This makes good accessibility for servicing and kit change. In various embodiments, the configuration of thermal head can also be changed to one, two or more heads, depending on the requirement by swapping the top assembly of the compact tester. In various embodiments, the compact tester can be used as a standalone apparatus (e.g. standalone tester or cell) or used together with a handler by docking a compact tester in a tester rack to the handler.

While the invention has been particularly shown and described with reference to specific embodiments, it should be understood by those skilled in the art that various changes, modification, variation in form and detail may be made therein without departing from the scope of the invention as defined by the appended claims. The scope of the invention is thus indicated by the appended claims and all changes which come within the meaning and range of equivalency of the claims are therefore intended to be embraced.

The invention claimed is:

1. A compact tester comprising:
a housing having a base plate and a roof plate defining a space therebetween, wherein the base plate and the roof plate are parallel to each other;
one or more device-under-test (DUT) press units disposed in the space and coupled to the roof plate, each DUT press unit having:
an actuator, and
a contact head coupled to the actuator, the contact head being movable by the actuator along an actuation axis parallel to a direction perpendicularly extending between the base plate and the roof plate; and
a reinforcement arrangement having:
a roof reinforcement sub-arrangement coupled to the roof plate, and
an upright reinforcement sub-arrangement extending from the base plate, the roof reinforcement sub-arrangement and the upright reinforcement sub-arrangement being interconnected to form the reinforcement arrangement,
wherein the upright reinforcement sub-arrangement comprises a pair of reinforcing side walls, each extending upright from the base plate,
wherein the roof reinforcement sub-arrangement comprises a reinforcing structure having a reinforcing panel portion attached flat against the roof plate and an elongated reinforcing rib portion protruding from the reinforcing panel portion and away from the roof plate,
wherein the roof reinforcement sub-arrangement is supported by the upright reinforcement sub-arrangement with the elongated reinforcing rib portion extending between the pair of reinforcing side walls in a manner such that each longitudinal end of the elongated reinforcing rib portion abuts an inner surface of a corresponding reinforcing side wall and a region of the reinforcing panel portion extending immediately from each longitudinal end of the elongated reinforcing rib portion engages a top of the corresponding reinforcing sidewall,
wherein the one or more DUT press units is coupled to the roof reinforcement sub-arrangement at the roof plate.

2. The compact tester of claim 1,
wherein the pair of reinforcing side walls of the upright reinforcement sub-arrangement are extending upright from opposite edges of the base plate.

3. The compact tester of claim 1,
wherein a length of the elongated reinforcing rib portion of the roof reinforcement sub-arrangement is equal to a distance apart between the inner surfaces of the pair of reinforcing side walls of the upright reinforcement sub-arrangement.

4. The compact tester of claim 1,
wherein the reinforcing panel portion of the roof reinforcement sub-arrangement is of an elongated form having an elongated flat surface which is attached flat against the roof plate with a length of the reinforcing panel portion extending across opposite edges of the roof plate.

5. The compact tester of claim 4,
wherein the elongated reinforcing rib portion of the roof reinforcement sub-arrangement is aligned longitudinally with the reinforcing panel portion in the elongated form.

6. The compact tester of claim 1,
wherein the elongated reinforcing rib portion of the roof reinforcement sub-arrangement is in the form of a long thin ridge along the reinforcing panel portion and protruding perpendicularly from the reinforcing panel portion and away from the roof plate.

7. The compact tester of claim 1, further comprising:
one or more DUT test sockets disposed inside the housing; and
an electronic control arrangement disposed inside the housing, the electronic control arrangement having:
a DUT press unit main controller coupled to the roof plate, and
a test controller coupled to the base plate,
whereby the test controller is for controlling a test program run in a DUT plugged into the one or more DUT test sockets.

8. The compact tester of claim 7, wherein the electronic control arrangement further comprises:
a first connector coupled to the test controller at the base plate, and
a second connector coupled to the DUT press unit controller at the roof plate,
wherein the first connector and the second connector are removably coupled to each other so as to electrically couple the DUT press unit controller and the test controller.

9. The compact tester of claim 1, wherein the housing comprises:
a first housing part comprising the base plate, and
a second housing part comprising the roof plate,
wherein the first housing part and the second housing part are removably couplable to each other,
wherein the first housing part and the second housing part are coupled together in a coupled configuration to form a complete housing enclosure structure whereby the base plate and the roof plate are parallel to each other.

10. The compact tester of claim 9, further comprising:
an interlocking arrangement comprising:
a first interlocking element coupled to the first housing part, and
a second interlocking element coupled to the second housing part,
wherein the first interlocking element and the second interlocking element are interlockable to hold the first housing part and the second housing part together in a manner so as to be non-separable in the direction perpendicularly extending between the base plate and the roof plate when the housing is in the coupled configuration.

11. The compact tester of claim 1, further comprising:
a drawer coupled to the housing in a manner so as to be slidably retractable and extendable relative to the housing between an extended position and a retracted position,
wherein in the extended position, the drawer is extended out of the housing, and wherein in the retracted position, the drawer is inserted into the space between the roof plate and the base plate of the housing.

12. The compact tester of claim 11, wherein the reinforcement arrangement further comprises:
a drawer reinforcement sub-arrangement having one or more support slabs disposed between an underneath surface of the drawer and the base plate and aligned between the pair of reinforcing sidewalls,
wherein each support slab abuts an underneath surface of the drawer when the drawer is in the retracted position.

13. The compact tester of claim 12,
wherein one or more DUT test sockets are disposed on the drawer in a manner such that the one or more DUT test sockets are aligned with the one or more DUT press units when the drawer is in the retracted position.

14. The compact tester of claim 1 further comprising:
at least one local controller circuit board electrically coupled to the one or more DUT press units;
wherein the at least one local controller circuit board is affixed to the reinforcing rib portion of the roof reinforcement sub-arrangement.

15. The compact tester of claim 1,
wherein each reinforcing side wall comprises at least one opening in the reinforcing side wall extending all the way through from the inner surface to an outer surface.

16. The compact tester of claim 15,
wherein each reinforcing side wall comprises a pair of openings in a side-by-side arrangement with a divider portion of the reinforcing side walls separating the pair of openings laterally,
wherein the divider portion of the pair of reinforcing side walls and the one or more DUT press units are aligned in a straight row.

17. The compact tester of claim 1, wherein the reinforcement arrangement further comprises:
a base reinforcement sub-arrangement having a base reinforcing panel attached flat against the base plate,
wherein the pair of reinforcing side walls of the upright reinforcement sub-arrangement are extending upright from opposite edges of the base reinforcing panel.

18. The compact tester of claim 17,
wherein the base reinforcing panel is of an elongated shape having an elongated flat surface which is attached flat against the base plate with a length of the base reinforcing panel extending across the opposite edges of the base plate.

19. A tester column comprising:

a rack with two or more docking slots arranged vertically; and two or more compact testers docked into the rack, wherein each compact tester comprises:

- a housing having a base plate and a roof plate defining a space therebetween, wherein the base plate and the roof plate are parallel to each other;
- one or more device-under-test (DUT) press units disposed in the space and coupled to the roof plate, each DUT press unit having:
  - an actuator, and
  - a contact head coupled to the actuator, the contact head being movable by the actuator along an actuation axis parallel to a direction perpendicularly extending between the base plate and the roof plate; and
- a reinforcement arrangement having:
  - a roof reinforcement sub-arrangement coupled to the roof plate, and
  - an upright reinforcement sub-arrangement extending from the base plate, the roof reinforcement sub-arrangement and the upright reinforcement sub-arrangement being interconnected to form the reinforcement arrangement,
  - wherein the upright reinforcement sub-arrangement comprises a pair of reinforcing side walls, each extending upright from the base plate,
  - wherein the roof reinforcement sub-arrangement comprises a reinforcing structure having a reinforcing panel portion attached flat against the roof plate and an elongated reinforcing rib portion protruding from the reinforcing panel portion and away from the roof plate,
  - wherein the roof reinforcement sub-arrangement is supported by the upright reinforcement sub-arrangement with the elongated reinforcing rib portion extending between the pair of reinforcing side walls in a manner such that each longitudinal end of the elongated reinforcing rib portion abuts an inner surface of a corresponding reinforcing side wall and a region of the reinforcing panel portion extending immediately from each longitudinal end of the elongated reinforcing rib portion engages a top of the corresponding reinforcing sidewall,
  - wherein the one or more DUT press units is coupled to the roof reinforcement sub-arrangement at the roof plate.

20. The tester column as claimed in claim 19, further comprising:

a distribution center; and a testers management arrangement coupled to the distribution center, the testers management arrangement comprising hardware components and devices connecting the distribution center to each docking slots.

* * * * *